(12) United States Patent
Kim et al.

(10) Patent No.: US 9,647,216 B2
(45) Date of Patent: May 9, 2017

(54) ORGANIC COMPOUND AND ORGANIC LIGHT EMITTING DIODE DEVICE INCLUDING THE SAME

(71) Applicants: SAMSUNG DISPLAY CO., LTD., Yongin, Gyeonggi-Do (KR); Pusan National University Industry-University Cooperation Foundation, Busan (KR)

(72) Inventors: Jae Hong Kim, Suwon-si (KR); Hong Suk Suh, Busan (KR); Myeong Suk Kim, Hwaseong-si (KR); Sung Wook Kim, Hwaseong-si (KR); Moon Jae Lee, Hwaseong-si (KR)

(73) Assignees: Samsung Display Co., Ltd., Yongin (KR); Pusan National University Industry-University Cooperation Foundation, Busan (KR)

( * ) Notice: Subject to any disclaimer, the term of this patent is extended or adjusted under 35 U.S.C. 154(b) by 309 days.

(21) Appl. No.: 14/340,474

(22) Filed: Jul. 24, 2014

(65) Prior Publication Data
US 2015/0243898 A1 Aug. 27, 2015

(30) Foreign Application Priority Data
Feb. 25, 2014 (KR) ........................ 10-2014-0022096

(51) Int. Cl.
*H01L 51/00* (2006.01)
*H01L 51/50* (2006.01)
*H01L 27/32* (2006.01)

(52) U.S. Cl.
CPC ...... *H01L 51/0067* (2013.01); *H01L 51/0061* (2013.01); *H01L 51/0072* (2013.01); *H01L 51/0081* (2013.01); *H01L 51/0085* (2013.01); *H01L 51/5016* (2013.01); *H01L 51/5056* (2013.01); *H01L 51/5072* (2013.01)

(58) Field of Classification Search
None
See application file for complete search history.

(56) References Cited

FOREIGN PATENT DOCUMENTS

| KR | 10-2007-0112631 A | 11/2007 |
| KR | 10-2010-0056490 A | 5/2010 |
| KR | 10-2011-0123106 A | 11/2011 |

OTHER PUBLICATIONS

Epstein et al. (Cancer Res. 1971, 31, p. 1087).*

* cited by examiner

*Primary Examiner* — J. L. Yang
(74) *Attorney, Agent, or Firm* — Lewis Roca Rothgerber Christie LLP

(57) ABSTRACT

A novel organic compound and an organic light emitting diode device using the same. The organic compound is represented by Chemical Formula 1:

Chemical Formula 1

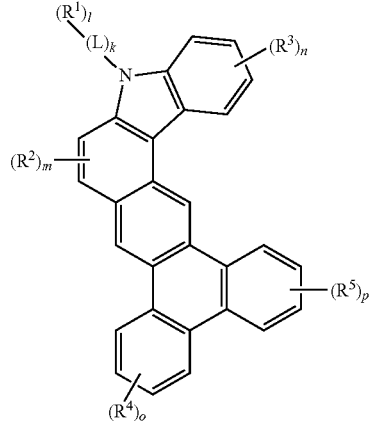

The organic compounds can provide improved electrical stability, high charge transport capability, a high glass transition temperature and may be capable of preventing crystallization. Also disclosed is an organic light emitting diode device including the compound of Chemical Formula 1 in the organic layer.

20 Claims, 1 Drawing Sheet

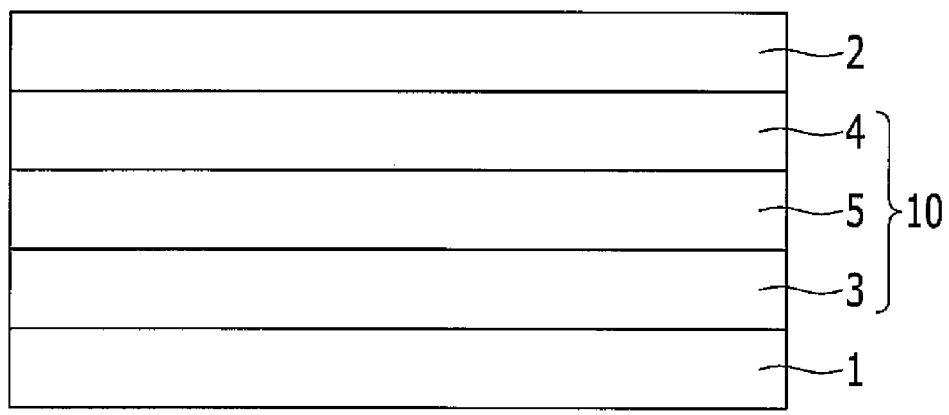

ORGANIC COMPOUND AND ORGANIC LIGHT EMITTING DIODE DEVICE INCLUDING THE SAME

CROSS-REFERENCE TO RELATED APPLICATION

This application claims priority to and the benefit of Korean Patent Application No. 10-2014-0022096 filed in the Korean Intellectual Property Office on Feb. 25, 2014, the entire content of which is incorporated herein by reference.

BACKGROUND

1. Field

Aspects of the present embodiments relate to an organic compound and an organic light emitting diode device including the same.

2. Description of the Related Art

Recent demand for reduced size and thickness of monitors, television sets, and the like has prompted a replacement of a cathode ray tube (CRT) with a liquid crystal display (LCD). However, liquid crystal display (LCD) is a non-emissive device and therefore needs a separate backlight. LCD is also limited in terms of response speed, viewing angle, and the like. In contrast, the organic light emitting diode device is a self-light-emitting display device that has a wide viewing angle, improved contrast and a fast response time. The organic light emitting diode device emits light when electrons injected from one electrode are combined with holes injected from the other electrode to form excitons and emit energy.

SUMMARY

One embodiment provides for a novel organic compound for an organic light emitting diode device.

Another embodiment provides for an organic light emitting diode device including the organic compound.

Yet another embodiment provides for a display device including the organic light emitting diode device.

One embodiment provides for a compound represented by the following Chemical Formula 1.

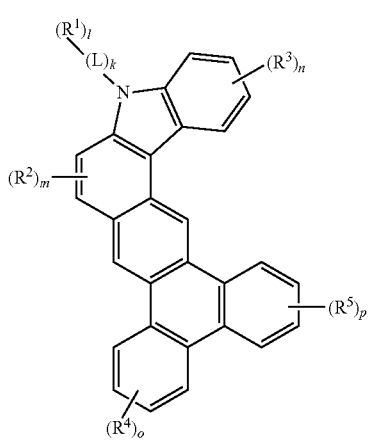

Chemical Formula 1

In the above Chemical Formula 1,
$R^1$ to $R^5$ are each independently a deuterium, a halogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C1 to C30 alkoxy group, a substituted or unsubstituted C6 to C30 aryloxy group, a substituted or unsubstituted C6 to C30 arylthiol group, a substituted or unsubstituted C6 to C30 aryl group, a substituted or unsubstituted C2 to C30 heteroaryl group, a substituted or unsubstituted C1 to C30 amine group, a substituted or unsubstituted silyl group, a cyano group, a nitro group, a hydroxy group, a carboxyl group, or a combination thereof, L is a substituted or unsubstituted C1 to C30 alkylene group, a substituted or unsubstituted C6 to C30 arylene group, a substituted or unsubstituted C2 to C30 heteroarylene group, or a combination thereof, k is an integer from 0 to 2, l is an integer from 1 to 3, m is an integer from 0 to 2, and n, o, and p are each independently integers from 0 to 4, provided that a and p are not simultaneously 0.

At least one of $R^4$ and $R^5$ may be a substituted or unsubstituted C1 to C30 amine group.

At least one of $R^4$ and $R^5$ may be a C1 to C30 amine group substituted with an aryl group.

m may be 0.

$R^1$ and $R^3$ may be each independently a substituted or unsubstituted C6 to C30 aryl group, a substituted or unsubstituted C2 to C30 heteroaryl group, or a substituted or unsubstituted C1 to C30 amine group.

$R^3$ may be a substituted or unsubstituted phenyl group, a substituted or unsubstituted biphenyl group, a substituted or unsubstituted naphthyl group, a substituted or unsubstituted anthracenyl group, or a substituted or unsubstituted phenanthrenyl group, a substituted or unsubstituted pyridinyl group, a substituted or unsubstituted pyrimidinyl group, a substituted or unsubstituted triazinyl group, a substituted or unsubstituted quinolinyl group, or a substituted or unsubstituted isoquinolinyl group.

L may be a substituted or unsubstituted C6 to C30 arylene group, or a substituted or unsubstituted C2 to C30 heteroarylene group.

The compound represented by the above Chemical Formula 1 may include at least one selected from Compounds 1-52.

At least one of $R^4$ and $R^5$ may be a C1 to C30 amine group substituted with an aryl group.

Another embodiment provides for an organic light emitting diode device including an anode, a cathode, and an organic layer between the anode and the cathode, the organic layer including the compound of Chemical Formula 1.

The organic layer may be an electron injection layer (EIL), an electron transport layer (ETL), a hole injection layer (HIL), a hole transport layer (HTL), or an emission layer.

The organic layer may be an electron injection layer (EIL) or an electron transport layer (ETL).

The electron transport layer (ETL) may include an electron transporting organic material and a metal-containing material.

The metal-containing material may include a Li complex.

The organic layer may be an emission layer.

The compound of Chemical Formula 1 may be used as a host in the emission layer.

The organic layer may be a hole injection layer (HIL) or a hole transport layer (HTL).

The hole injection layer (HIL) or hole transport layer (HTL) may further include a charge-generating material.

Yet another embodiment provides for a display device including the organic light emitting diode device.

Other embodiments are described in the detailed description.

The organic light emitting diode device including the compound according to embodiments of the present invention has improved luminance and life-span characteristics, and high luminous efficiency at a low driving voltage.

BRIEF DESCRIPTION OF THE DRAWING

The FIGURE is a cross-sectional schematic view showing a structure of an organic light emitting diode device according to one embodiment.

DETAILED DESCRIPTION

The present disclosure will be described more fully hereinafter with reference to the accompanying drawings, in which exemplary embodiments of this disclosure are shown. However, this disclosure may be embodied in many different forms and is not construed as limited to the exemplary embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, the use of "may" when describing embodiments of the present invention refers to "one or more embodiments of the present invention."

As used herein, when a definition is not otherwise provided, the term "substituted" refers to a compound in which at least one hydrogen atom is substituted with at least one selected from a deuterium, a C1 to C30 alkyl group, a C6 to C30 aryl group, a C1 to C30 heteroaryl group, a C1 to C30 alkoxy group, a C2 to C30 alkenyl group, a C6 to C30 aryloxy group, a C1 to C30 silyloxy group, a C1 to C30 acyl group, a C2 to C30 acyloxy group, a C2 to C30 heteroaryloxy group, a C1 to C30 sulfonyl group, a C1 to C30 alkylthiol group, a C6 to C30 arylthiol group, a C1 to C30 heterocyclothiol group, a C1 to C30 phosphoric acid amide group, a C3 to C30 silyl group, NRR' (wherein, R and R' are each independently a substituent selected from hydrogen, a C1 to C30 alkyl group and/or a C6 to C30 aryl group), a carboxyl group, a halogen, a cyano group, a nitro group, an azo group, a fluorene group and/or a hydroxy group.

Two adjacent substituents of the substituted C1 to C30 alkyl group, C6 to C30 aryl group, C1 to C30 heteroaryl group, C1 to C30 alkoxy group, C2 to C30 alkenyl group, C6 to C30 aryloxy group, C1 to C30 silyloxy group, C1 to C30 acyl group, C2 to C30 acyloxy group, C2 to C30 heteroaryloxy group, C1 to C30 sulfonyl group, C1 to C30 alkylthiol group, C6 to C30 arylthiol group, C1 to C30 heterocyclothiol group, C1 to C30 phosphoric acid amide group, C3 to C30 silyl group, NRR' (wherein, R and R' are each independently a substituent selected from hydrogen, a C1 to C30 alkyl group and/or a C6 to C30 aryl group), carboxyl group, halogen, cyano group, nitro group, azo group, fluorene group, or hydroxy group may be fused together to form a ring.

As used herein, when a definition is not otherwise provided, the term "hetero" refers to a compound having at least 1 to 3 heteroatoms selected from B, N, O, S, and P in the main chain or ring and carbon atoms as the remaining atoms in the main chain or ring.

As used herein, when a definition is not otherwise provided, the "combination thereof" refers to two or more substituents linked to each other by a single bond, or two or more substituents condensed (or fused) with each other.

As used herein, the "organic layer" may refer to a layer including an organic material, but the organic layer is not limited thereto and may include an inorganic material, a metal complex, and the like, in addition to the organic material, and may include at least one layer.

The unsubstituted C1 to C30 alkyl group may be linear or branched, and non-limiting examples thereof include methyl, ethyl, propyl, isobutyl, sec-butyl, pentyl, iso-amyl, hexyl, heptyl, octyl, nonyl, dodecyl groups, and the like.

The unsubstituted C2 to C30 alkenyl group may refer to a hydrocarbon chain having at least one carbon-carbon double bond at one or more positions along a carbon chain of the unsubstituted alkyl group. For example, the unsubstituted C2-C30 alkenyl group may include a terminal alkene and/or an internal alkene. Non-limiting examples thereof include ethenyl, propenyl, butenyl groups, and the like.

The unsubstituted C2 to C30 alkynyl group may refer to a hydrocarbon chain having at least one carbon-carbon triple bond at one or more positions along a carbon chain of the unsubstituted alkyl group. For example, the unsubstituted C2-C30 alkynyl group may include a terminal alkyne and/or an internal alkyne. Non-limiting examples thereof include acetylene, propylene, phenylacetylene, naphthylacetylene, isopropylacetylene, t-butylacetylene, diphenylacetylene, and the like.

The unsubstituted C3 to C30 cycloalkyl group may refer to a cyclic alkyl group having 3 to 30 carbon atoms.

The unsubstituted C1 to C30 alkoxy group may refer to —OA group (wherein, A is the above-described unsubstituted C1 to C30 alkyl group, and non-limiting examples of the unsubstituted C1 to C30 alkoxy group include methoxy, ethoxy, propoxy, isopropyloxy, butoxy, pentoxy groups, and the like.

The unsubstituted C6 to C30 aryl group may refer to a carbocyclic aromatic system having at least one ring. When the aryl group has two or more rings, the rings may be fused to each other or linked via a single bond and the like. The term aryl may refer to an aromatic system such as phenyl, naphthyl, anthracenyl, and the like. The unsubstituted C6 to C30 aryl group may be selected from a phenyl group, a biphenylyl group, a tolyl group, a naphthyl group, an anthracenyl group, a terphenyl group, a naphthacenyl group, a phenanthrenyl group, a pyrenyl group, a diphenylanthracenyl group, a dinaphthylanthracenyl group, a chrysenyl group, a triphenylenyl group, a perylenyl group, a pentacenyl group, a bromophenyl group, a hydroxyphenyl group, a stilbene group, an azobenzenyl group, and/or a ferrocenyl group.

The unsubstituted C1 to C30 heteroaryl group may refer to a unsubstituted C6 to C30 aryl group having 1, 2 or 3 heteroatoms selected from N, O, S, and P as ring atoms. When the heteroaryl group has two or more rings, the rings may be fused to each other or linked via a single bond and the like. Non-limiting examples of the unsubstituted C1 to C30 heteroaryl group include a pyrazolyl group, an imidazolyl group, an oxazolyl group, a thiazolyl group, a triazinyl group, a triazolyl group, a tetrazolyl group, an oxadiazolyl group, a thiadiazolyl group, a pyridinyl group, a pyridazinyl group, a pyrimidinyl group, a carbazolyl group, an indolyl group, a quinolinyl group, an isoquinolinyl group, a thiophene group, a dibenzothiophene group, a dibenzofuran group, and a benzimidazolyl group.

The unsubstituted C6 to C30 aryloxy group may refer to —OA$^1$ group, wherein A$^1$ is the same functional group as the above-described C6 to C30 aryl group, but may have different number of carbon atoms. Non-limiting examples of the aryloxy group may include a phenoxy group, and the like.

The unsubstituted C6 to C30 arylthio group may refer to —SA$^1$ group, wherein A$^1$ is the same functional group as the above-described C6 to C30 aryl group, but may have different number of carbon atoms. Non-limiting examples of the arylthio group may include a benzenethio group, a naphthylthio group, and the like.

In one embodiment, an organic compound is represented by the following Chemical Formula 1:

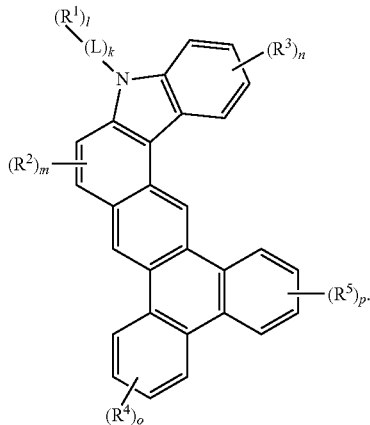

Chemical Formula 1

In the above Chemical Formula 1,

R$^1$ to R$^5$ are each independently hydrogen, deuterium, a halogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C1 to C30 alkoxy group, a substituted or unsubstituted C6 to C30 aryloxy group, a substituted or unsubstituted C6 to C30 arylthiol group, a substituted or unsubstituted C6 to C30 aryl group, a substituted or unsubstituted C2 to C30 heteroaryl group, a substituted or unsubstituted C1 to C30 amine group, a substituted or unsubstituted silyl group, a cyano group, a nitro group, a hydroxy group, a carboxyl group, or a combination thereof, L is a substituted or unsubstituted C1 to C30 alkylene group, a substituted or unsubstituted C6 to C30 arylene group, a substituted or unsubstituted C2 to C30 heteroarylene group, or a combination thereof, k is an integer from 0 to 2, l is an integer from 1 to 3, m is an integer from 0 to 2, and n, o, and p are each independently integers from 0 to 4, provided that o and p are not simultaneously 0.

The compound represented by Chemical Formula 1 may be prepared by condensing triphenylene and carbazole and may be used as green, red or blue light emitting material, since the compound shifts a wavelength toward a long wavelength.

In addition, since the triphenylene and carbazole respectively have excellent electronic and electric performance, the compound prepared by condensing triphenylene and carbazole, such as the compound represented by the above Chemical Formula 1, may improve hole and electron characteristics.

The hole characteristics refer to how easily the hole formed in the anode can be injected into the emission layer and transported in the emission layer due to conductive characteristics according to HOMO level. Specifically, such characteristics are similar to electron-repelling characteristics.

The electron characteristics refer how easily the electron formed in the cathode can be injected into the emission layer and transported in the emission layer due to conductive characteristics according to LUMO level. Specifically, such characteristics are similar to electron-withdrawing characteristics.

The compound represented by the above Chemical Formula 1 may have various substituents and thus may have various energy bandgaps.

Accordingly, an appropriate energy level of the compound may be provided depending on the substituents and thus, the compound may improve hole transport capability or electron transport capability of an organic optoelectronic device, efficiency and driving voltage, and may have good electrochemical and thermal stability, thus improving life-span characteristics during the operation of the organic optoelectronic device.

According to one embodiment, in the compound of Chemical Formula 1, at least one of R$^4$ and R$^5$ may be a substituted or unsubstituted C1 to C30 amine group. When an amine group is linked to a condensed compound of triphenylene and carbazole, the amine group may optimize electric balance of the condensed compound.

In one embodiment, at least one of R$^4$ and R$^5$ may be a C1 to C30 amine group substituted with an aryl group. The aryl group may be a substituted or unsubstituted phenyl group, a substituted or unsubstituted naphthyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenylyl group, a substituted or unsubstituted p-terphenyl group, a substituted or unsubstituted m-terphenyl group, a substituted or unsubstituted chrysenyl group, a substituted or unsubstituted triphenylenyl group, and/or a substituted or unsubstituted perylenyl group, but is not limited thereto.

In one embodiment, m may be 0.

In one embodiment, R$^1$ and R$^3$ may be each independently a substituted or unsubstituted C6 to C30 aryl group, a substituted or unsubstituted C2 to C30 heteroaryl group, or a substituted or unsubstituted C1 to C30 amine group. When a substituent having various electric characteristics is introduced into the carbazole moiety, electric balance of the resulting compound may be optimized.

In one embodiment, R$^3$ may be a substituted or unsubstituted phenyl group, a substituted or unsubstituted biphenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyrimidinyl group, a substituted or unsubstituted triazinyl group, a substituted or unsubstituted quinolinyl group, and/or a substituted or unsubstituted isoquinolinyl group.

In one embodiment, L may be a substituted or unsubstituted C6 to C30 arylene group, or a substituted or unsubstituted C2 to C30 heteroarylene group. When a particular linking group capable of adjusting the electric characteristics is introduced, electric characteristics of the resulting compound may be adjusted with substantial precision.

In addition, when an arylene group or a heteroarylene group is linked to a nitrogen atom (N) of the condensed compound of triphenylene and carbazole in the above Chemical Formula 1, electric balance of the condensed compound may be optimized, and hole and/or electron characteristics of the condensed compound represented by Chemical Formula 1 may be appropriately adjusted.

In addition, L may be selected to adjust the entire conjugation length of the compound, which may adjust the triplet energy bandgap of the compound. Accordingly, characteristics of a material required (or desired) of an organic light emitting diode device may be realized. In addition, the triplet energy bandgap may be adjusted by changing bonding positions of substituents of L between ortho, para, and meta positions.

Non-limiting examples of L may include a substituted or unsubstituted phenylene group, a substituted or unsubstituted biphenylene group, a substituted or unsubstituted terphenylene group, a substituted or unsubstituted naphthylene group, a substituted or unsubstituted anthracenylene group, a substituted or unsubstituted phenanthrylene group, a substituted or unsubstituted pyrenylene group, a substituted or unsubstituted fluorenylene group, a substituted or unsubstituted pyridinylene group, a substituted or unsubstituted pyrimidinylene group, and/or a substituted or unsubstituted triazinylene group.

The compound of Chemical Formula 1 may be one selected from the following Group 1 or may be a mixture of at least two or more compounds selected from the following Group 1, or may be mixed with other compounds, but the compound of Chemical Formula 1 is not limited thereto.

Group 1

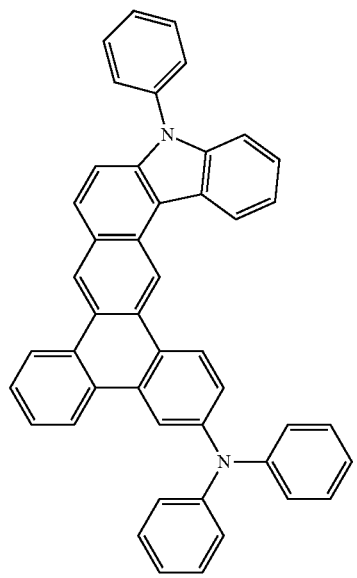

1

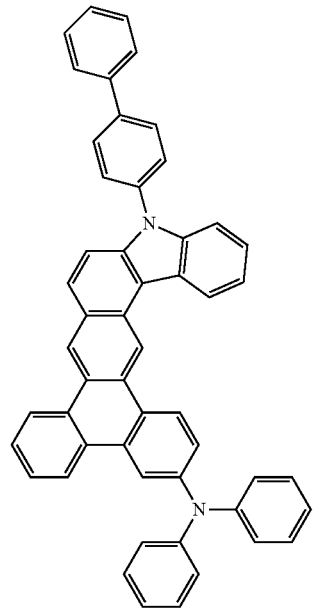

2

-continued

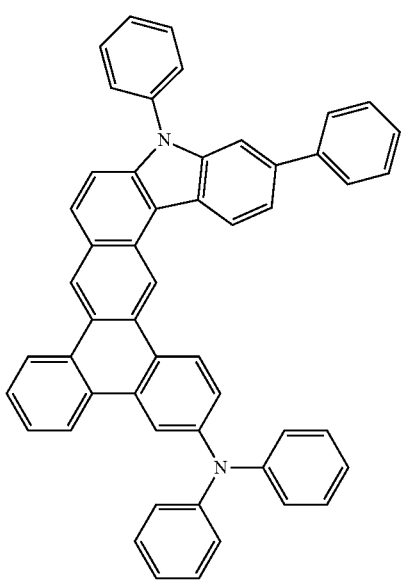

3

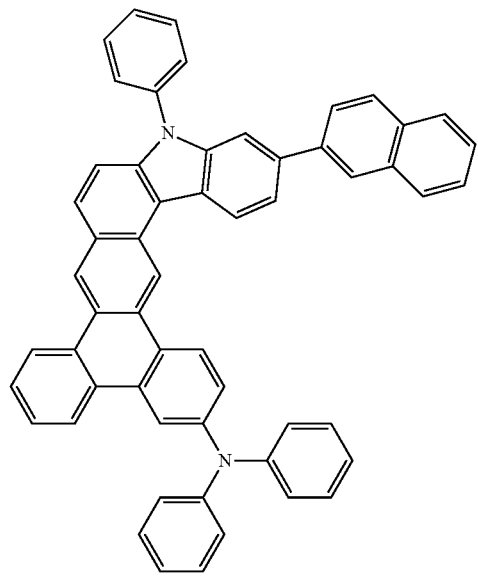
5
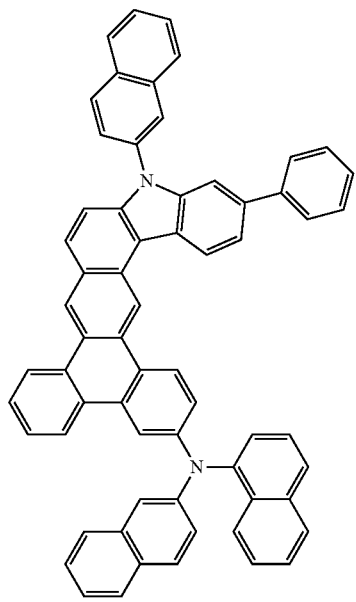
6
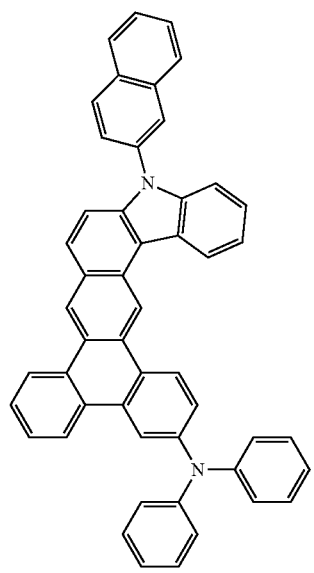
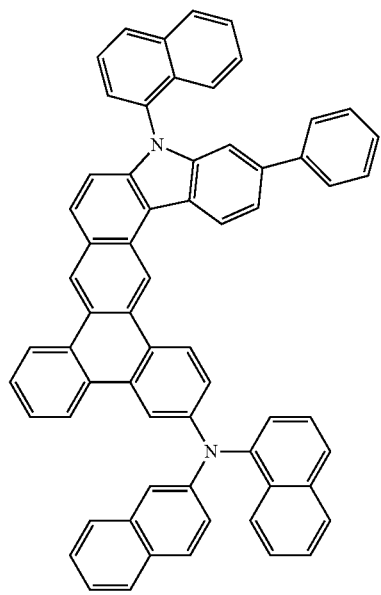
7

8
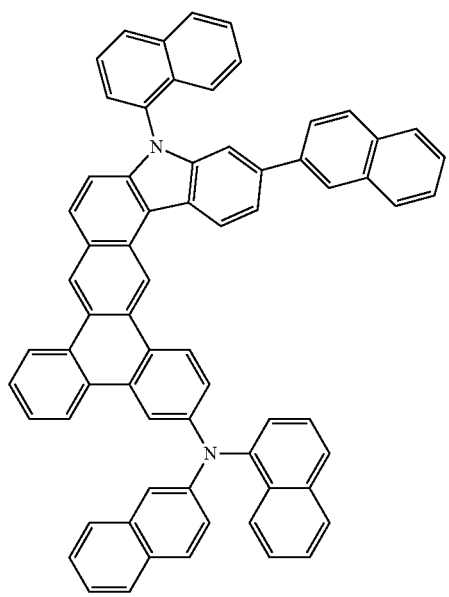
9
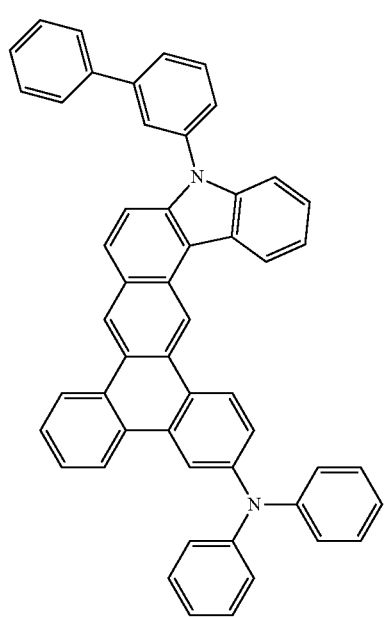
10
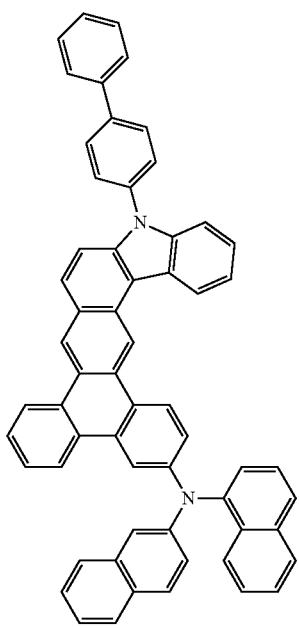
11
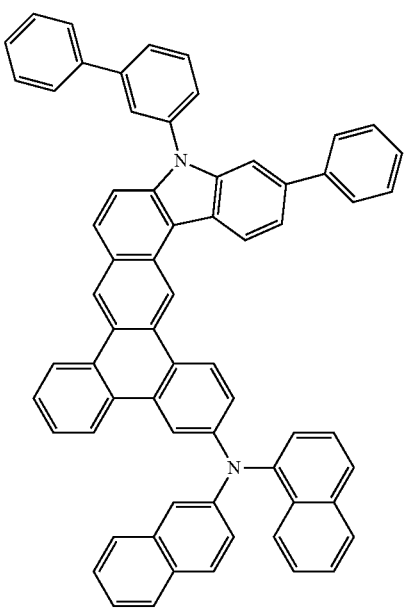

12
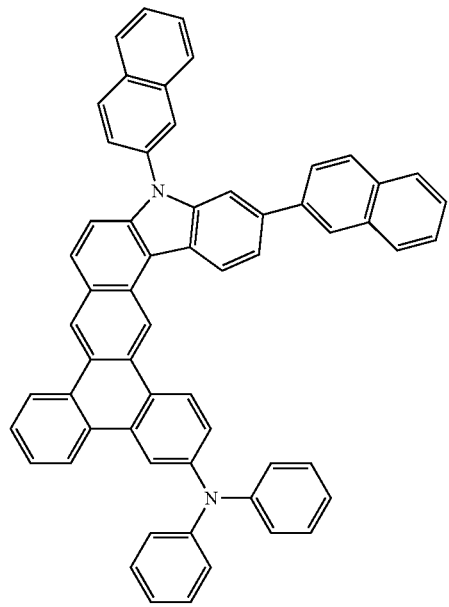
14
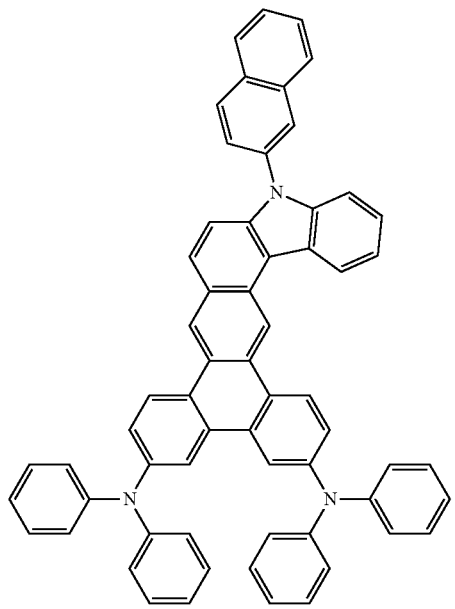
13
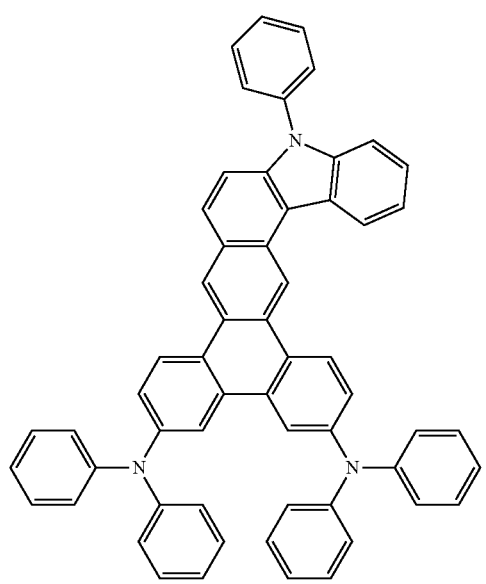
15
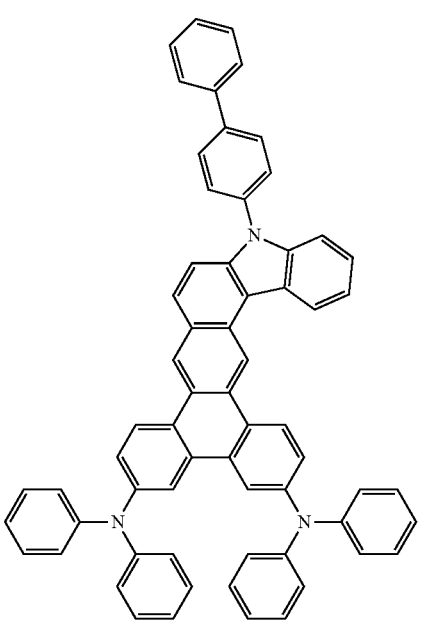

16
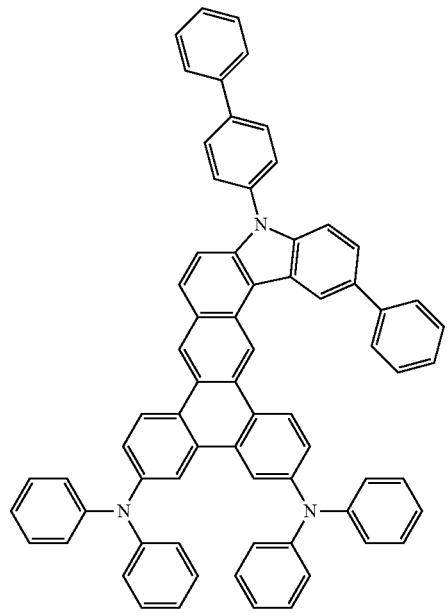
17
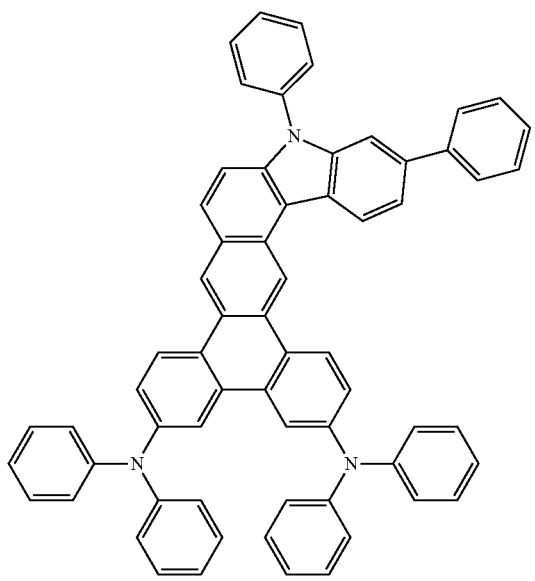
18
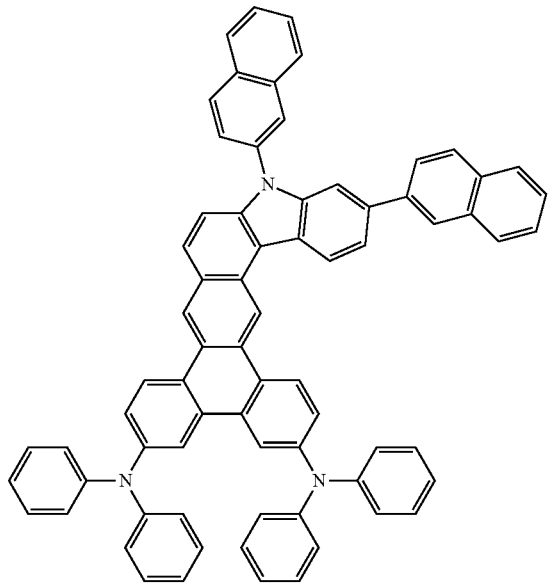
19
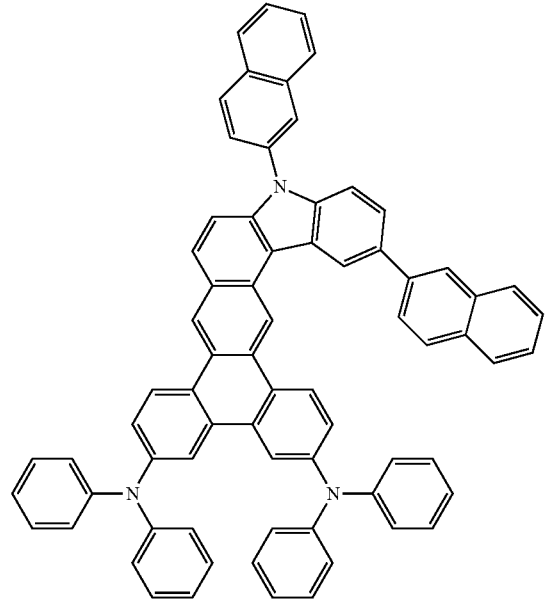

20
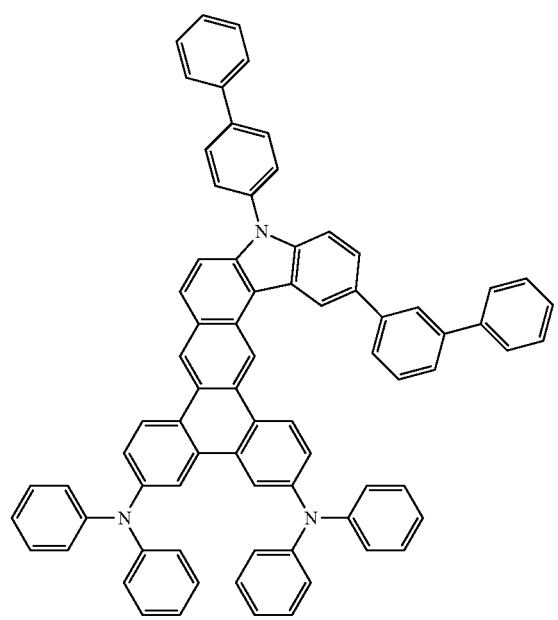
21
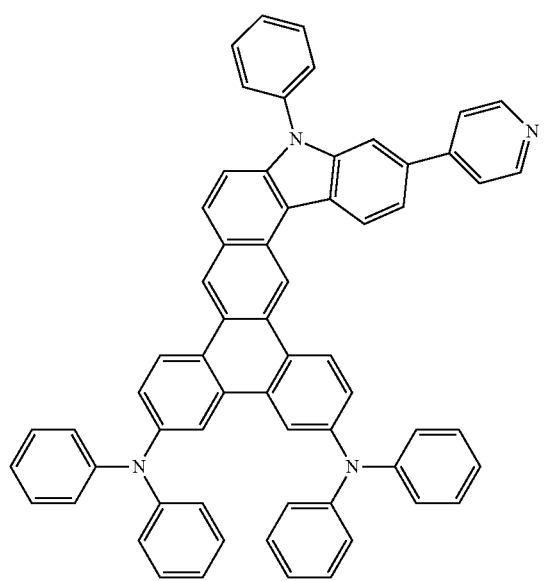
22
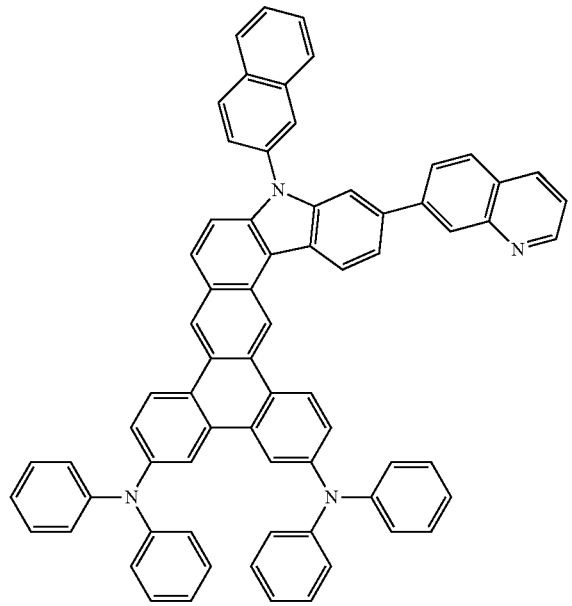
23
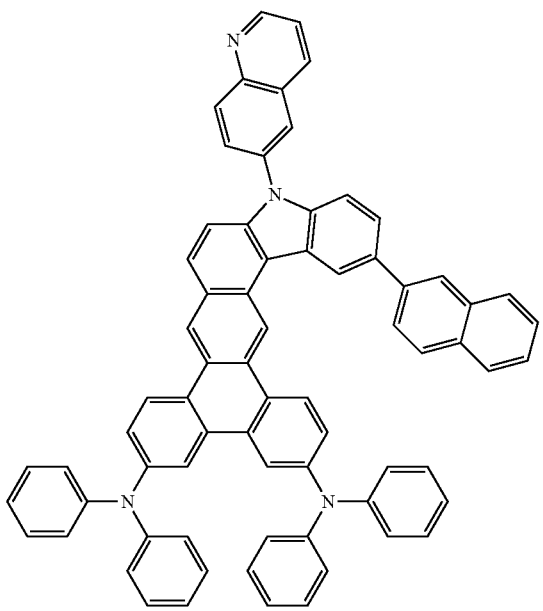

24
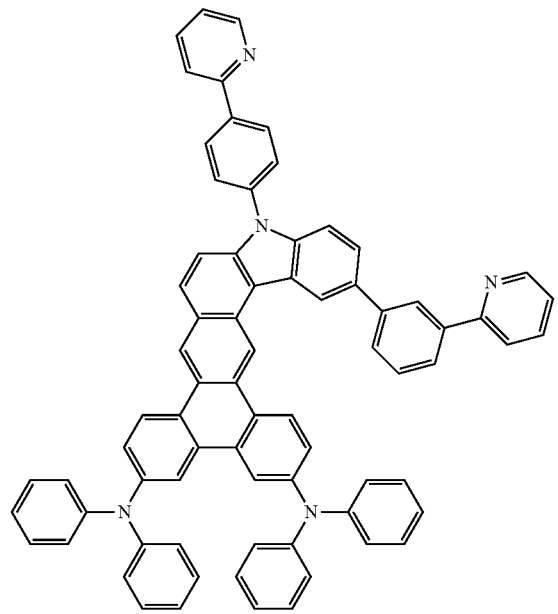
26
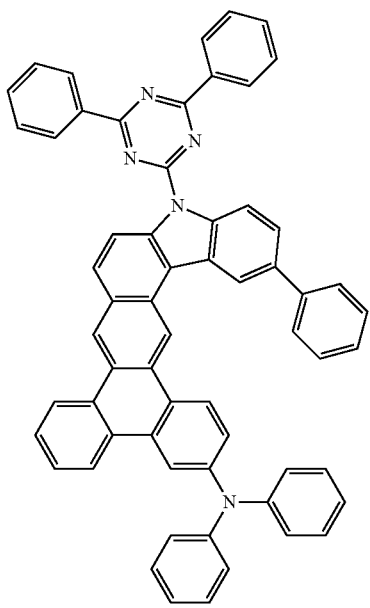
25
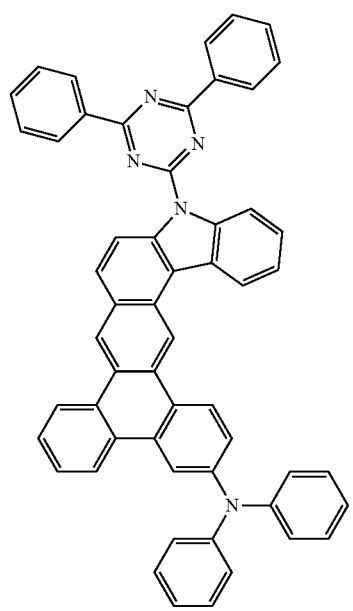
27
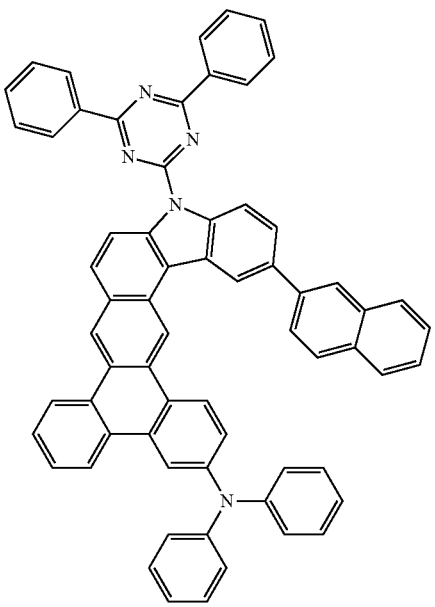

28
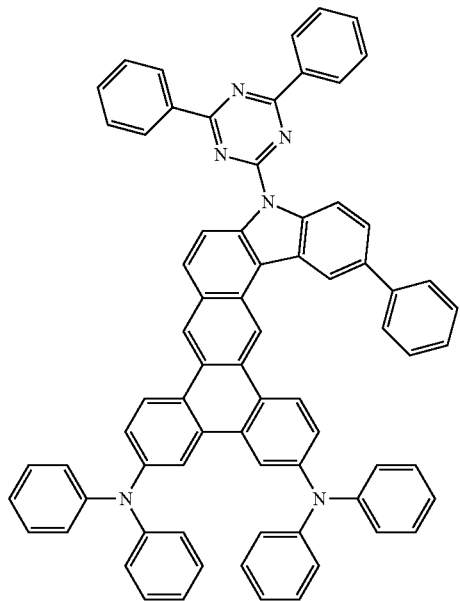
29
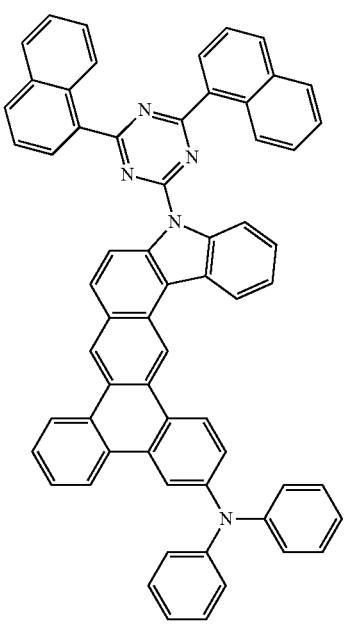
30
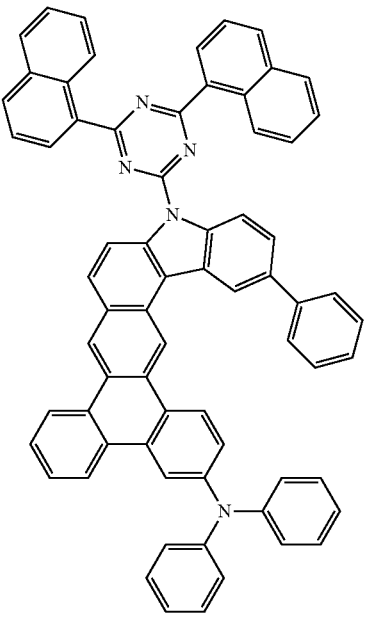
31
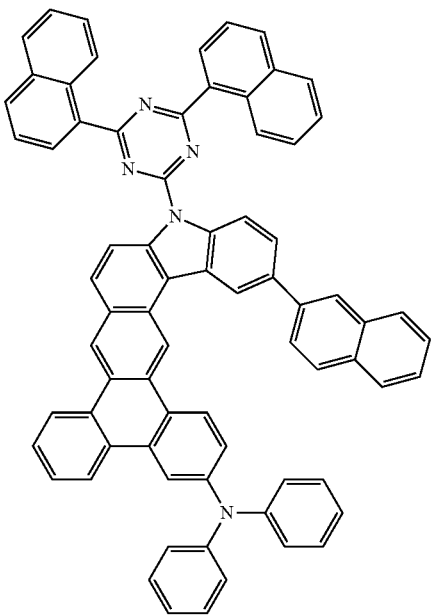

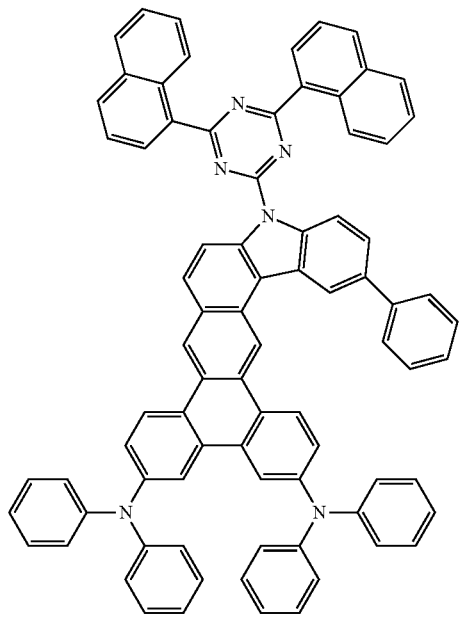
32
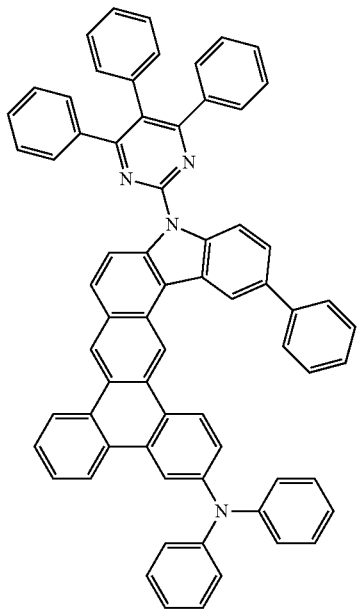
34
33
35

36
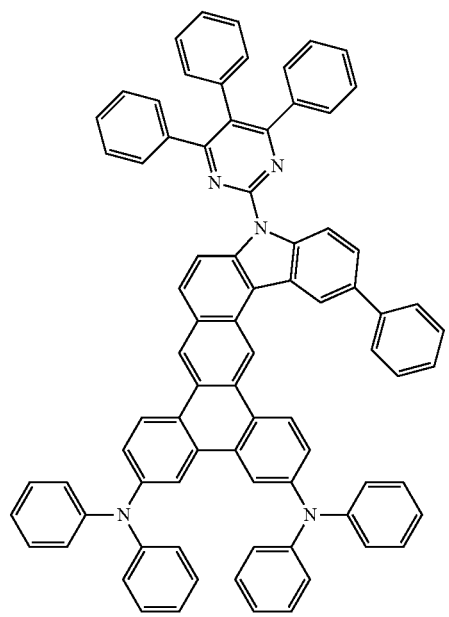
37
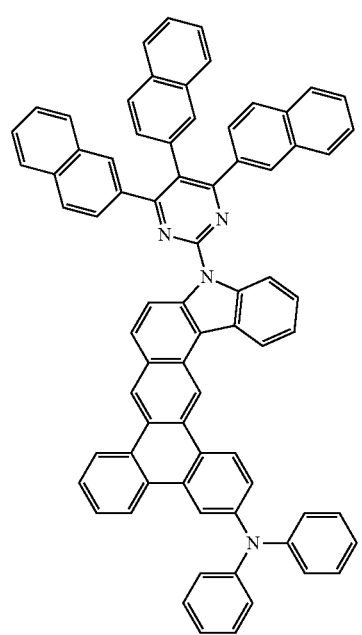
38
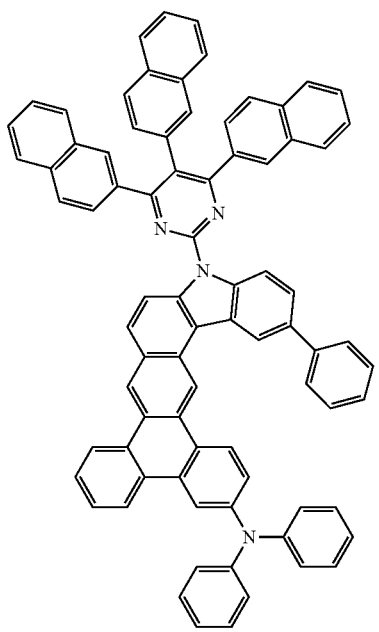
39
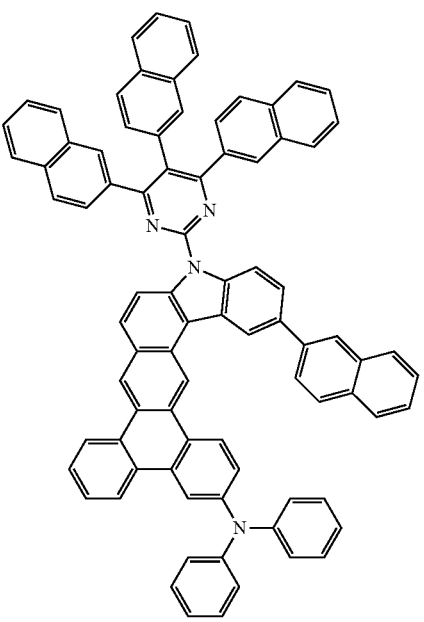

40
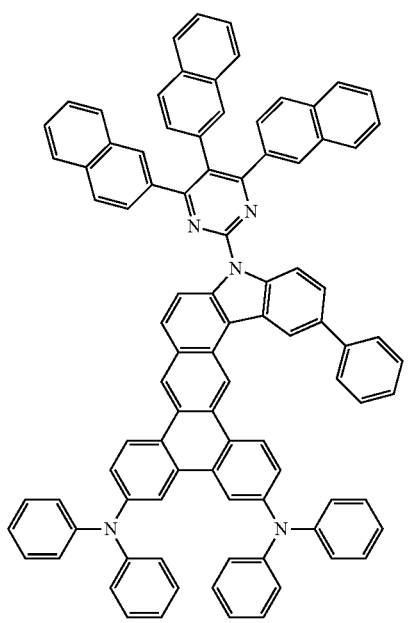
41
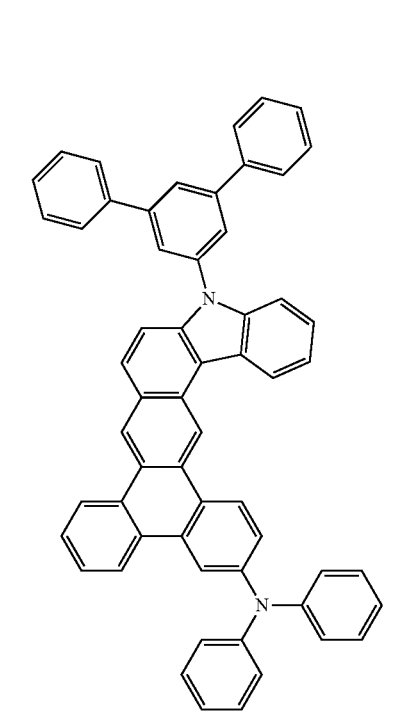
42
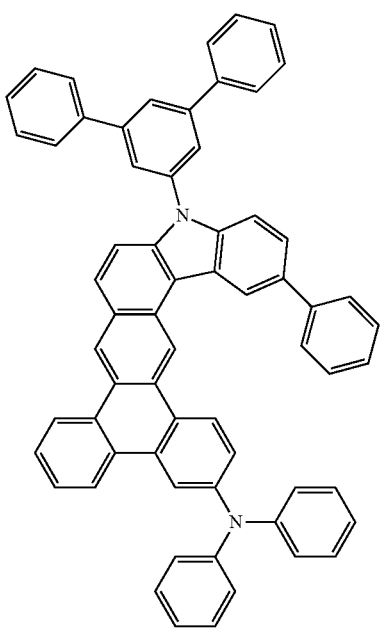
43
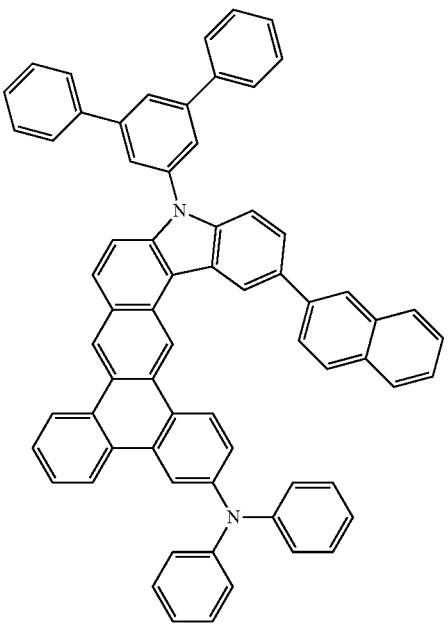

44
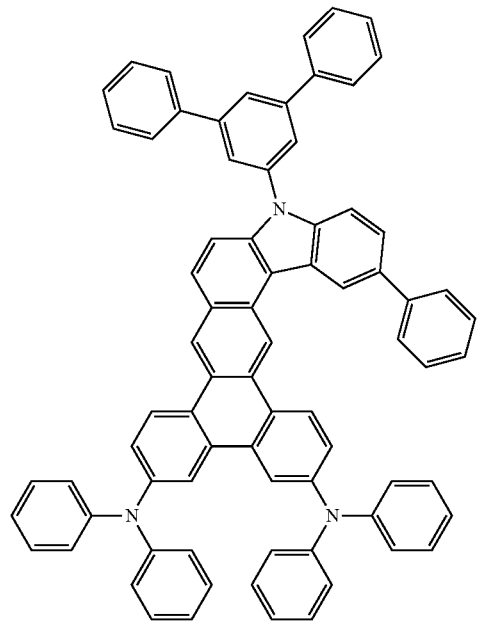
46
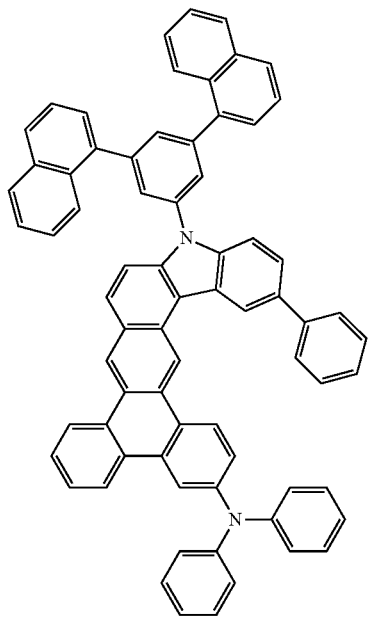
45
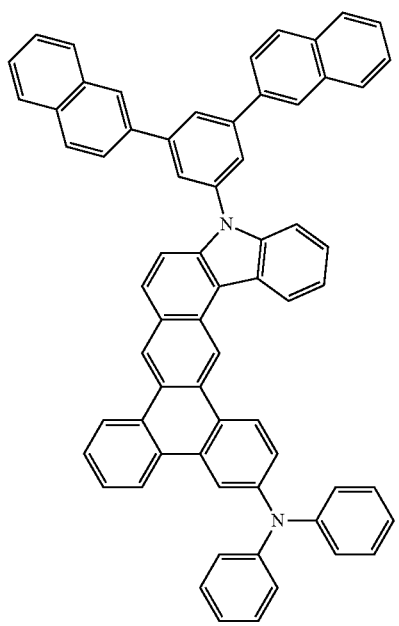
47
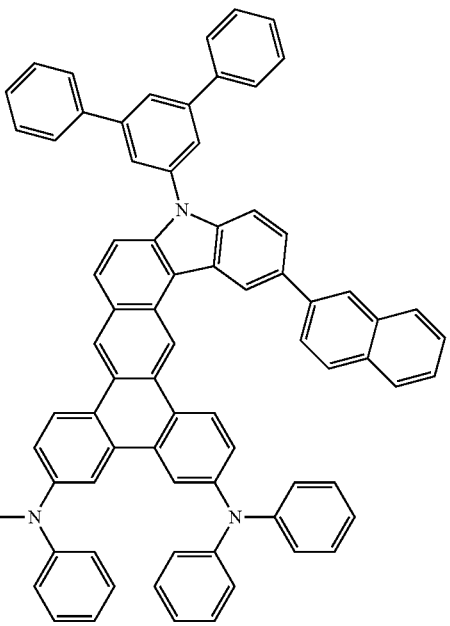

48
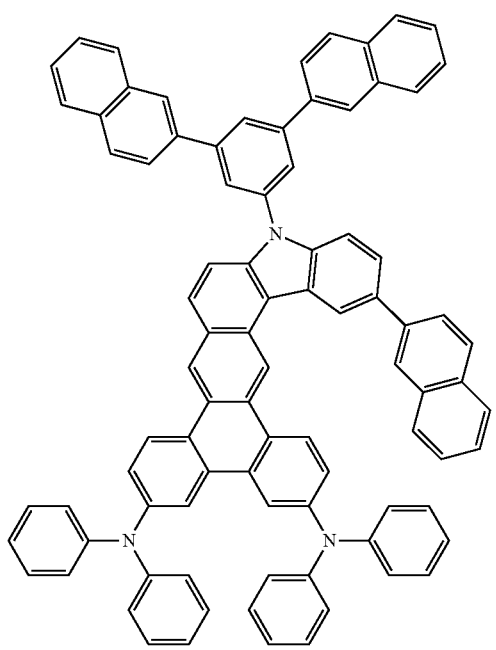
49
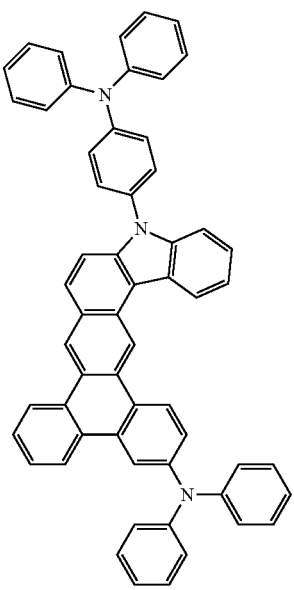
50
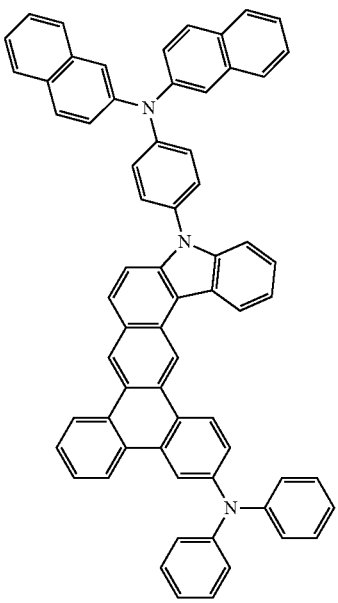
51
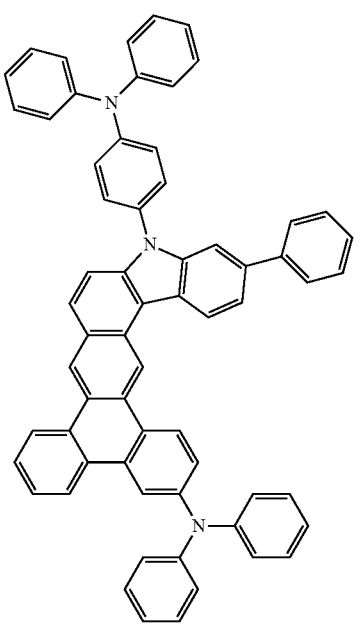

-continued

52

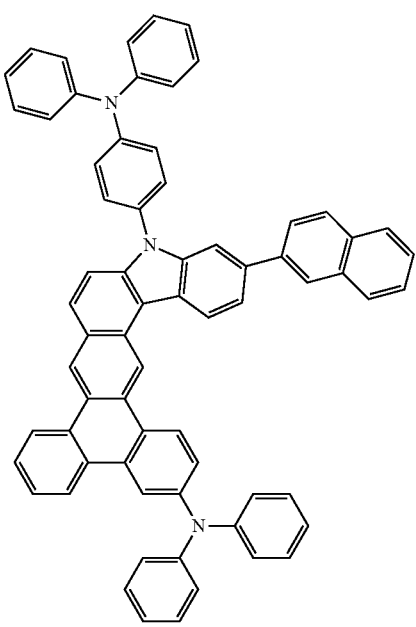

Hereinafter, the compounds listed in Group 1 are referred to as Compound 1 through Compound 52.

Hereinafter, an organic light emitting diode device according to one embodiment is described referring to the FIGURE.

The FIGURE is a cross-sectional schematic view showing a structure of an organic light emitting diode device according to one embodiment.

Referring to the FIGURE, an organic light emitting diode device according to one embodiment includes an anode 1, a cathode 2 facing the anode 1, and an organic layer 10 between the anode 1 and the cathode 2.

A substrate (not shown) may be positioned on the side of the anode 1 or on the side of the cathode 2. The substrate may be made of an inorganic material such as glass or an organic material such as polycarbonate, polymethylmethacrylate, polyethyleneterephthalate, polyethylenenaphthalate, polyamide, polyethersulfone, or a combination thereof, a silicon wafer, and/or the like.

At least one of the anode 1 and the cathode 2 may be a transparent electrode which may be formed of, for example, a conductive oxide such as indium tin oxide (ITO), indium zinc oxide (IZO), tin oxide ($SnO_2$), zinc oxide (ZnO), or a combination thereof, or a metal such as aluminum, silver, or magnesium, and may be formed to be a thin electrode.

At least one of the anode 1 and the cathode 2 may include a metal, an alloy, an electrically conductive compound, or a mixture thereof having a small work function, and may include, for example and without limitation, lithium (Li), magnesium (Mg), aluminum (Al), aluminum-lithium (Al—Li), calcium (Ca), magnesium-indium (Mg—In), magnesium-silver (Mg—Ag), or a combination thereof.

In one embodiment, the anode may be a transparent electrode including indium tin oxide (ITO), and the cathode may be a metal electrode such as aluminum, and/or the like.

In one embodiment, the organic layer 10 includes an emission layer 5, a hole auxiliary layer 3 between the anode 1 and emission layer 5, and an electron auxiliary layer 4 between the cathode 2 and emission layer 5. However, at least one of the hole auxiliary layer 3 and electron auxiliary layer 4 may be omitted.

The emission layer 5 may include the compound of Chemical Formula 1. The compound may be used by itself or in a mixture with, for example, another organic material. When the compound is mixed with another organic material, the compound may function as a fluorescent or phosphorescent host, and may include dopants. In some embodiments, when the compound of Chemical Formula 1 is mixed with another organic material, the compound may function as a host, and in some embodiments as a phosphorescent host.

Examples of a red dopant may include PtOEP, Ir(piq)$_3$, Btp$_2$Ir(acac), DCJTB, and the like, but are not limited thereto.

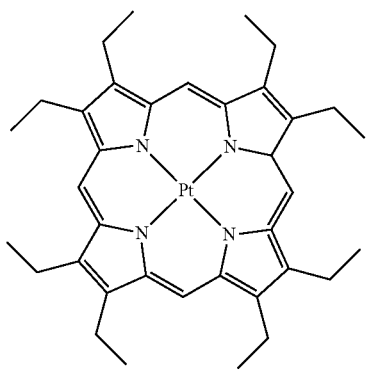

PtOEP

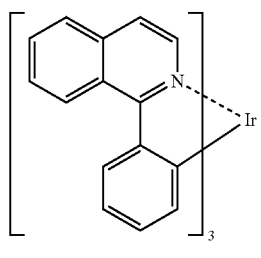

Ir(piq)$_3$

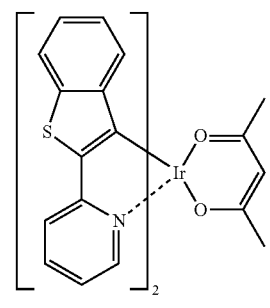

Btp$_2$Ir(acac)

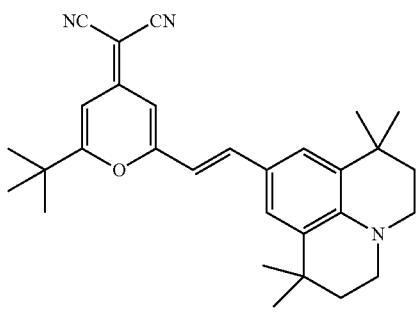

DCJTB

Examples of a green dopant may include Ir(ppy)$_3$ (ppy=phenylpyridine), Ir(ppy)$_2$(acac), Ir(mpyp)$_3$, C545T, and the like, but are not limited thereto.

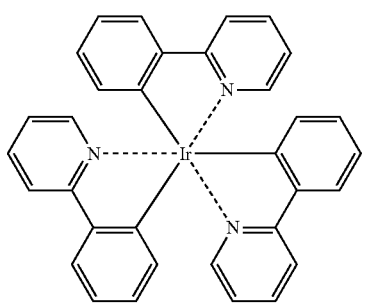

Ir(ppy)₃

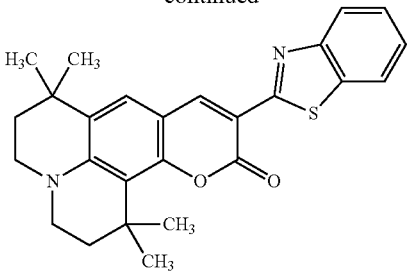

C545T

Examples of a blue dopant may include F₂Irpic, (F₂ppy)₂Ir(tmd), Ir(dfppz)₃, ter-fluorene, 4,4'-bis(4-diphenylaminostyryl)biphenyl (DPAVBi), 2,5,8,11-tetra-ter-butyl perylene (TBP), and the like, but are not limited thereto.

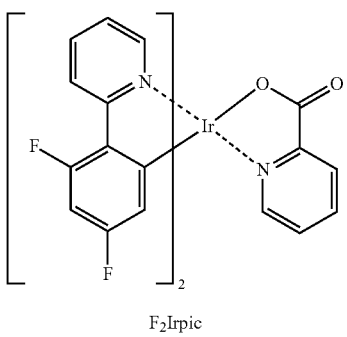

F₂Irpic

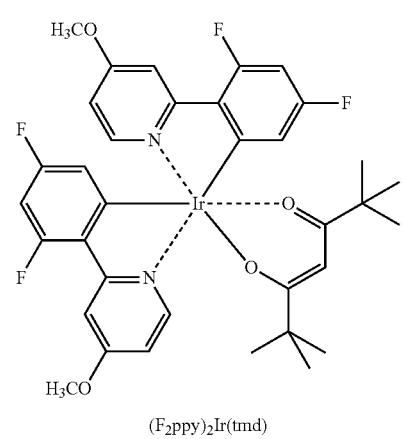

(F₂ppy)₂Ir(tmd)

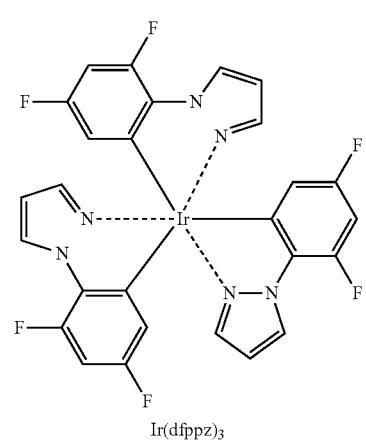

Ir(dfppz)₃

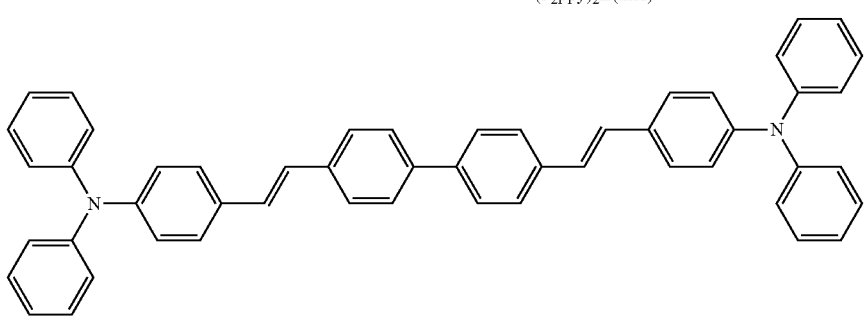

DPAVBi

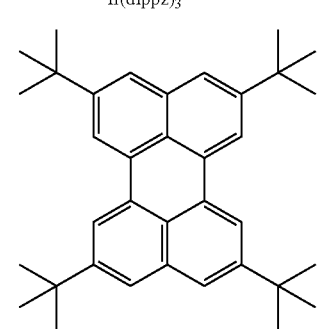

TBP

-continued

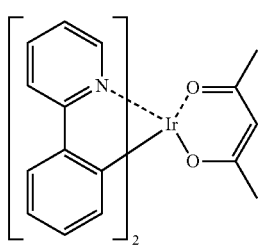

Ir(ppy)₂(acac)

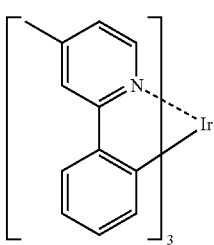

Ir(mpyp)₃

The dopant may be included in an amount of about 0.1 to about 15 parts by weight based on 100 parts by weight of emission layer forming material (i.e. total weight of the host and the dopant is 100 parts by weight), but the amount of the dopant is not limited thereto. Within the above range of the dopant, a concentration extinction phenomenon may be substantially suppressed (or reduced).

The emission layer 5 may emit white light by a combination of the three primary colors of red, green and blue, and the combination of colors may be implemented by combining the adjacent sub-pixels or stacking the sub-pixels in a vertical direction to emit white light.

The electron auxiliary layer 4 may be between the emission layer 5 and cathode 2 and may increase electron mobility. The electron auxiliary layer 4 may include, for example, at least one selected from an electron injection layer (EIL), an electron transport layer (ETL), and a hole blocking layer, but the electron auxiliary layer 4 is not limited thereto.

In one embodiment, the electron auxiliary layer 4 may include the organic compound of Chemical Formula 1. In one embodiment, the organic compound of Chemical Formula 1 may be included in the electron transport layer (ETL). The electron transport layer (ETL) may additionally include any suitable electron transport layer (ETL)-forming material. For example, a quinoline derivative such as tris(8-quinolinolate)aluminum ($Alq_3$), TAZ, Balq, and/or the like may be used, but the material for forming the ETL is not limited thereto.

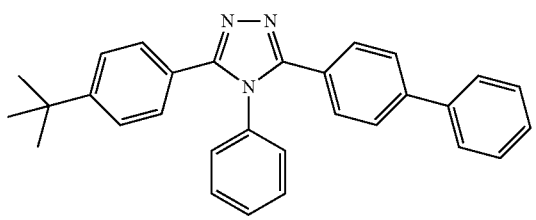

TAZ

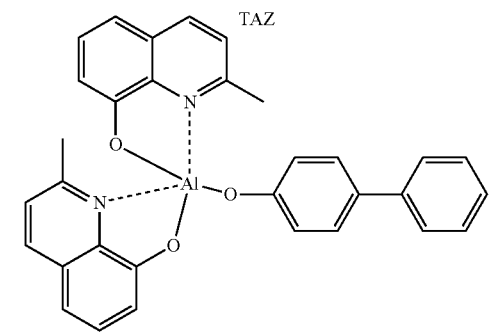

BAlq

In one embodiment, an electron transport layer (ETL) may include an electron transport organic compound and a metal-containing material. Non-limiting examples of the electron transport organic compound may include 9,10-di(naphthalen-2-yl)anthracene (ADN), and an anthracene-based compound such as the following Compounds 101 and 102.

Compound 101

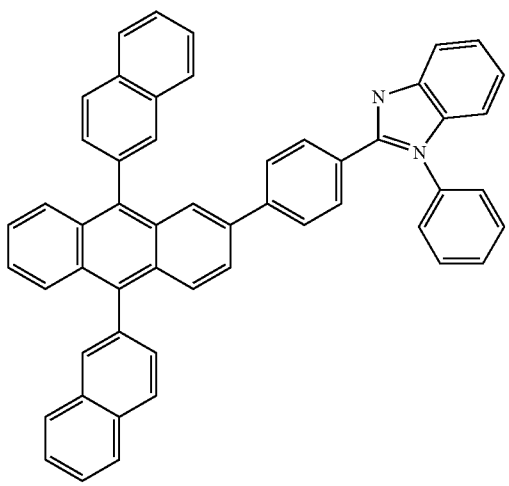

Compound 102

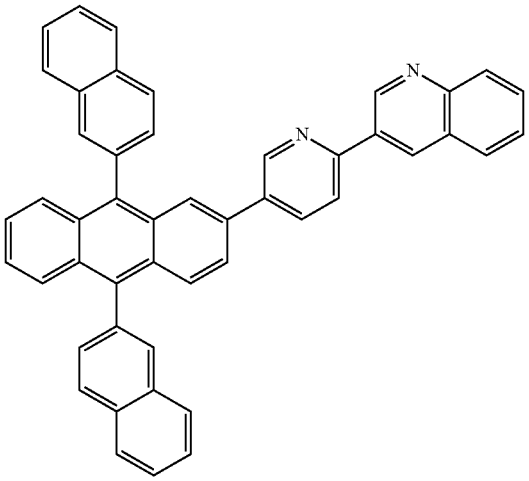

The metal-containing material may include a Li complex. Non-limiting examples of the Li complex may include lithium quinolate (LiQ) or the following compound 103.

Compound 103

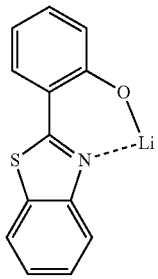

The hole blocking layer material is not particularly limited, and may include any suitable hole blocking layer material. For example, an oxadiazole derivative, a triazole derivative, a phenanthroline derivative, Balq, BCP, and/or the like may be used, but the hole blocking layer material is not limited thereto.

The hole auxiliary layer 3 may be between the emission layer 5 and the anode 1 and may increase hole mobility. The hole auxiliary layer 3 may include, for example, at least one layer selected from a hole injection layer (HIL), a hole transport layer (HTL), and an electron blocking layer, but the hole auxiliary layer 3 is not limited thereto.

The hole auxiliary layer 3 may include the compound of Chemical Formula 1. In one embodiment, the compound may be included in the hole transport layer (HTL). The hole transport layer (HTL) may additionally include any suitable hole transport layer (HTL)-forming material. For example, a carbazole derivative such as N-phenylcarbazole, polyvinylcarbazole, 4,4',4"-tris(carbazol-9-yl)-triphenylamine (TCTA) and the like; an amine derivative having an aromatic condensed ring such as NPB (N,N'-di(1-naphthyl)-N,N'-diphenylbenzidine), N,N'-bis(3-methylphenyl)-N,N'-diphenyl-[1,1-biphenyl]-4,4'-diamine (TPD) and the like may be used, but the material for forming the HTL is not limited thereto. When TCTA is used as the hole transport layer (HTL)-forming material, it may prevent the diffusion of excitons from the emission layer, and is capable of transporting a hole.

nylamino)triphenylamine], NPB (N,N'-di(1-naphthyl)-N,N'-diphenylbenzidine), TDATA, 2T-NATA, Pani/DBSA (polyaniline/dodecylbenzenesulfonic acid), PEDOT/PSS (poly(3,4-ethylenedioxythiophene)/poly(4-styrenesulfonate)), pani/CSA (polyaniline/camphor sulfonic acid) or PANT/PSS (polyaniline)/poly(4-styrenesulfonate)), and the like.

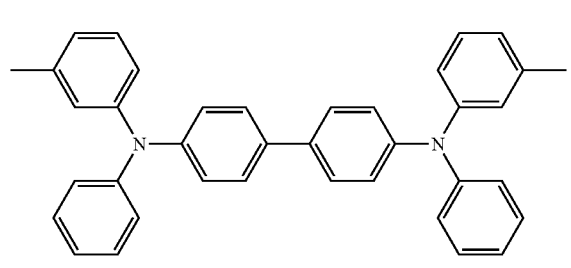

TPD

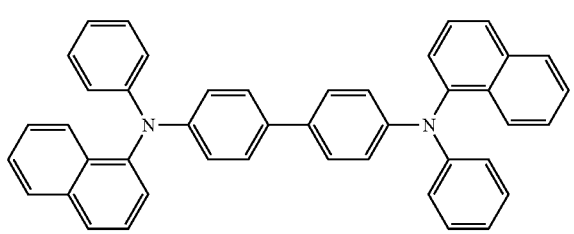

NPB

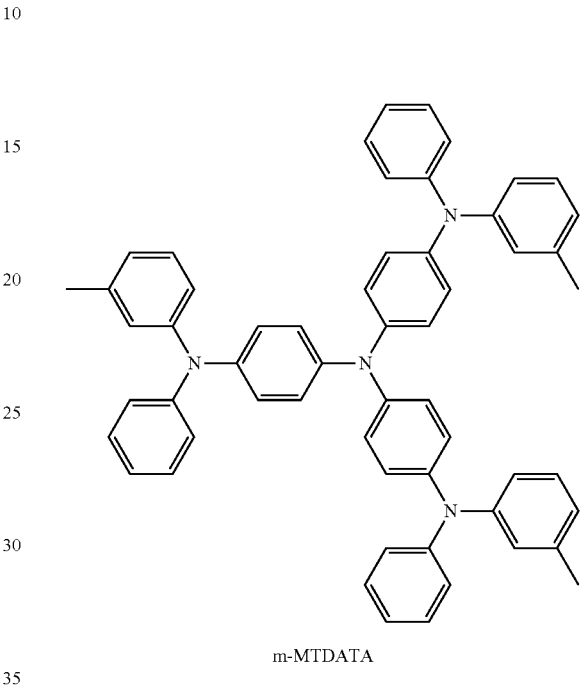

m-MTDATA

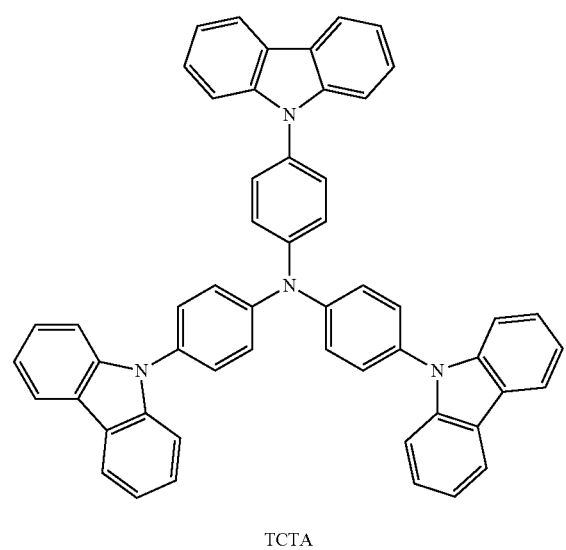

TCTA

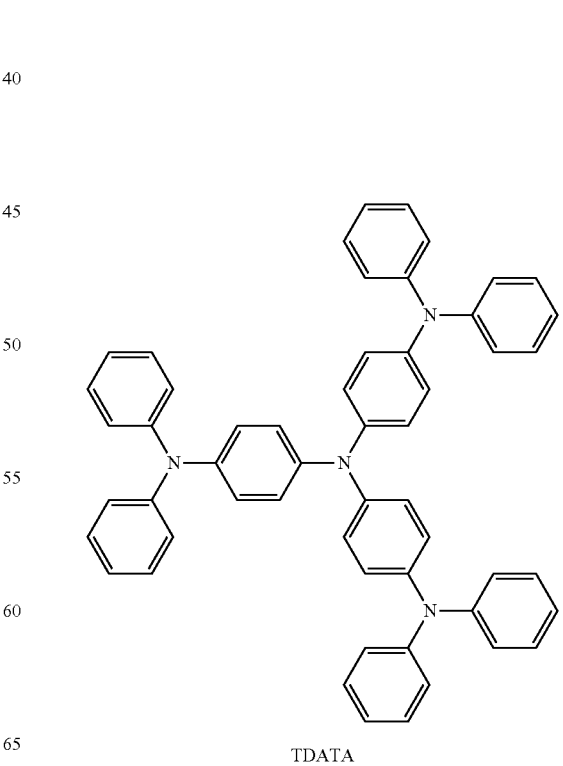

TDATA

The hole injection layer (HIL) may include any suitable hole injection material including, without limitation, a phthalocyanine compound such as copper phthalocyanine, and the like, m-MTDATA [4,4',4"-tris(3-methylphenylphe-

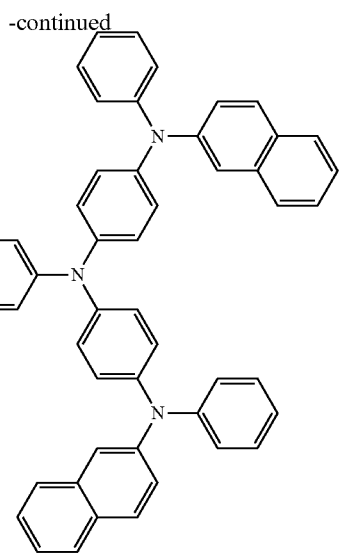

2T-NATA

The hole injection layer (HIL) or the hole transport layer (HTL) may further include a charge-generating material so as to improve film conductivity.

The charge-generating material may be, for example, a p-dopant. Non-limiting examples of the p-dopant may include a quinone derivative such as tetracyanoquinone dimethane (TCNQ) and 2,3,5,6-tetrafluoro-tetracyano-1,4-benzoquinonedimethane (F4TCNQ); a metal oxide such as tungsten oxide and molybdenum oxide; and a cyano group-contained compound such as the following compound 100 or the like.

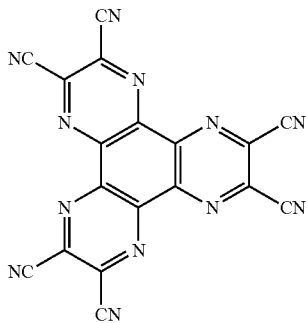

Compound 100

When the hole injection layer (HIL) or the hole transport layer (HTL) further includes the charge-generating material, the charge-generating material may be uniformly dispersed in the layers or randomly distributed in the layers.

In one embodiment, the organic light emitting diode device may have a structure of anode/hole injection layer (HIL)/emission layer/cathode, anode/hole injection layer (HIL)/hole transport layer (HTL)/emission layer/electron transport layer (ETL)/cathode, or anode/hole injection layer (HIL)/hole transport layer (HTL)/emission layer/electron transport layer (ETL)/electron injection layer (EIL)/cathode. In one embodiment, the organic light emitting diode device may have a structure of anode/functional layer having hole injection function and hole transport function/emission layer/electron transport layer (ETL)/cathode or anode/functional layer having a hole injection function and a hole transport function/emission layer/electron transport layer (ETL)/electron injection layer (EIL)/cathode. Alternatively, the organic light emitting diode device may have a structure of anode/hole transport layer (HTL)/emission layer/functional layer having electron injection function and electron transport function/cathode, anode/hole injection layer (HIL)/emission layer/functional layer having electron injection function and electron transport function/cathode, or anode/hole injection layer (HIL)/hole transport layer (HTL)/emission layer/functional layer having electron injection function and electron transport function/cathode structure, but the structure of the organic light emitting diode device is not limited thereto.

The organic layer 10 may be formed by various methods such as vacuum deposition, spin coating, casting, Langmuir-Blodgett deposition (LB) or the like, but the method for forming the organic layer 10 is not limited thereto.

When the organic layer is formed by vacuum deposition, the deposition conditions may be different depending on the compound used as the material for forming the organic layer, the structure of the desired organic layer, and thermal characteristics. In one embodiment, the deposit temperature may be of about 100 to about 500° C., the vacuum degree may be of about $10^{-8}$ to about $10^{-3}$ torr, and the deposition rate may be of about 0.01 to about 100 Å/sec, but the deposition conditions are not limited thereto.

When the organic layer is formed by spin coating, the coating conditions may be different depending on the compound used as a material for forming the organic layer, the structure of the desired organic layer, and thermal characteristics or the like. In one embodiment, coating speed may be of about 2000 rpm to about 5000 rpm, and heat treatment temperature may be of about 80° C. to about 200° C. for removing the solvent after coating, but the coating conditions are not limited thereto.

In one embodiment, the organic layer 10 includes the compound of Chemical Formula 1, and the organic layer may be an emission layer.

The compound of Chemical Formula 1 may be used as a host in the emission layer, In one embodiment, the compound may be used as a phosphorescent host in the emission layer.

The organic layer 10 may further include at least one selected from a hole injection layer (HIL), a hole transport layer (HTL), an electron blocking layer, a hole blocking layer, an electron transport layer (ETL), and an electron injection layer (EIL), in addition to the emission layer.

The organic light emitting diode device may be electrically connected to, for example, a thin film transistor, and the thin film transistor may be positioned between the substrate and electrode.

In one embodiment, the first layer of an organic light emitting diode device may be formed by depositing the organic compound according to one embodiment of the present invention or may be also formed by a wet method of coating the organic compound according to one embodiment in a solution.

Hereinafter, the present invention will be described with reference to the following synthesis examples and other examples. However, these examples are for illustrative purposes only and are not intended to limit the scope of the present invention.

SYNTHESIS EXAMPLES

Synthesis Example 1

Synthesis of Compound 1

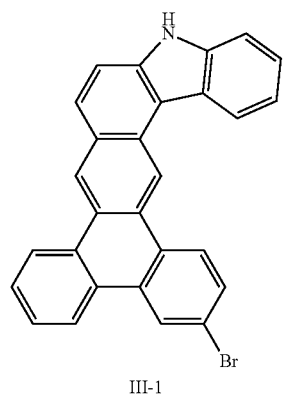

III-1

+

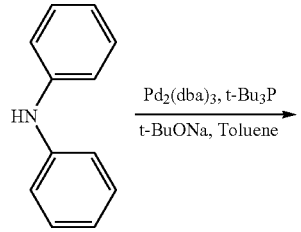

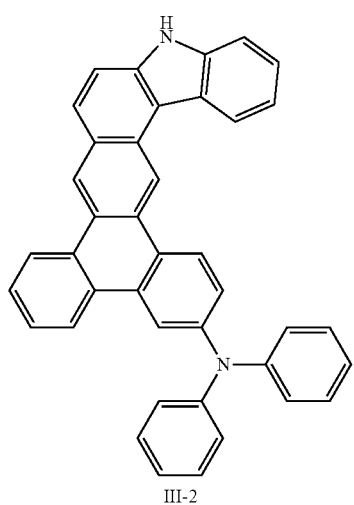

III-2

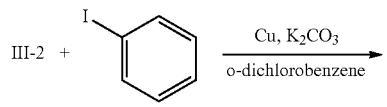

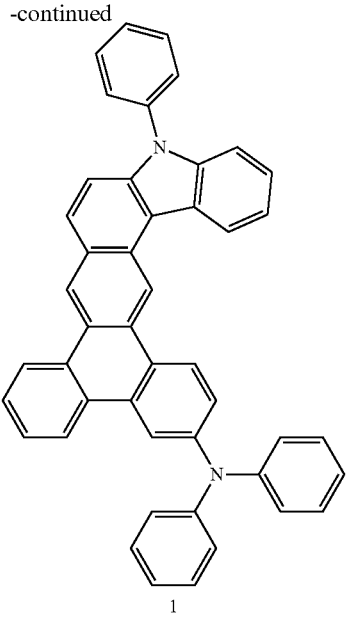

1

Synthesis of Intermediate III-2

102.1 mg (0.11 mmol) of $Pd_2(dba)_3$ and 45.1 mg (0.22 mmol) of $t\text{-}Bu_3P$ were dissolved in 50 ml of o-xylene, and the solution was agitated for 10 minutes. 5 g (11.15 mmol) of 16-Bromo-8H-triphenyleno[2,3-c]carbazole, 3.77 g (22.30 mmol) of diphenylamine, and 643.1 mg (6.69 mmol) of t-BuONa were added thereto, and the mixture was refluxed and agitated at 160° C. for 48 hours. When the reaction was complete, 20 ml of cold distilled water was added thereto, and the mixture was extracted with ethylacetate. The extracted mixture was dried with magnesium sulfate and filtered, and a solvent therein was evaporated. Then, 4.43 g of Intermediate III-2 (N,N-diphenyl-8H-triphenyleno[2,3-c]carbazol-16-amine) (yield: 74%) was obtained through column chromatography.

$^1$H NMR (300 MHz, $CDCl_3$), d (ppm): 9.05-8.95 (1H, s), 8.76-8.66 (2H, m), 8.48-8.40 (1H, s), 8.32-8.20 (2H, m), 8.12-8.05 (1H, d), 8.00-7.92 (1H, d), 7.80-7.71 (2H, m), 7.69-7.57 (2H, m), 7.55-7.48 (1H, m), 7.41-7.34 (1H, s), 7.30-7.17 (6H, m), 7.15-7.07 (4H, m), 7.02-6.92 (2H, m).

EI-MS, m/e: 534.21 (calculation value), 534.22 (measurement value).

Synthesis of Compound 1

5 g (9.32 mmol) of Intermediate III-2, 2.09 g (10.25 mmol) of iodobenzene, 1.78 g (27.95 mmol) of copper powder, and 4.12 g (29.81 mmol) of $K_2CO_3$ were dissolved in 60 ml of o-dichlorobenzene, and the solution was refluxed and agitated at 140° C. for 12 hours. When the reaction was complete, 20 ml of distilled water was added thereto, and the mixture was extracted with ethylacetate. The extracted mixture was dried with magnesium sulfate and filtered, and a solvent therein was evaporated. Then, 3.41 g of Compound 1 (N,N,8-triphenyl-8H-triphenyleno[2,3-c]carbazol-16-amine) (yield: 60%) was obtained through column chromatography.

$^1$H NMR (300 MHz, $CDCl_3$), d (ppm): 9.11-9.00 (1H, s), 8.77-8.67 (2H, m), 8.49-8.40 (1H, s), 8.34-8.28 (1H, d), 8.27-8.19 (1H, m), 8.14-8.06 (1H, m), 8.05-7.98 (1H, m), 7.82-7.71 (3H, m), 7.70-7.64 (1H, m), 7.64-7.56 (3H, m), 7.50-7.42 (2H, m), 7.33-7.19 (7H, m), 7.15-7.07 (4H, m), 7.01-6.92 (2H, m).

EI-MS, m/e: 610.24 (calculation value), 610.23 (measurement value).

Synthesis Example 2

Synthesis of Compound 5

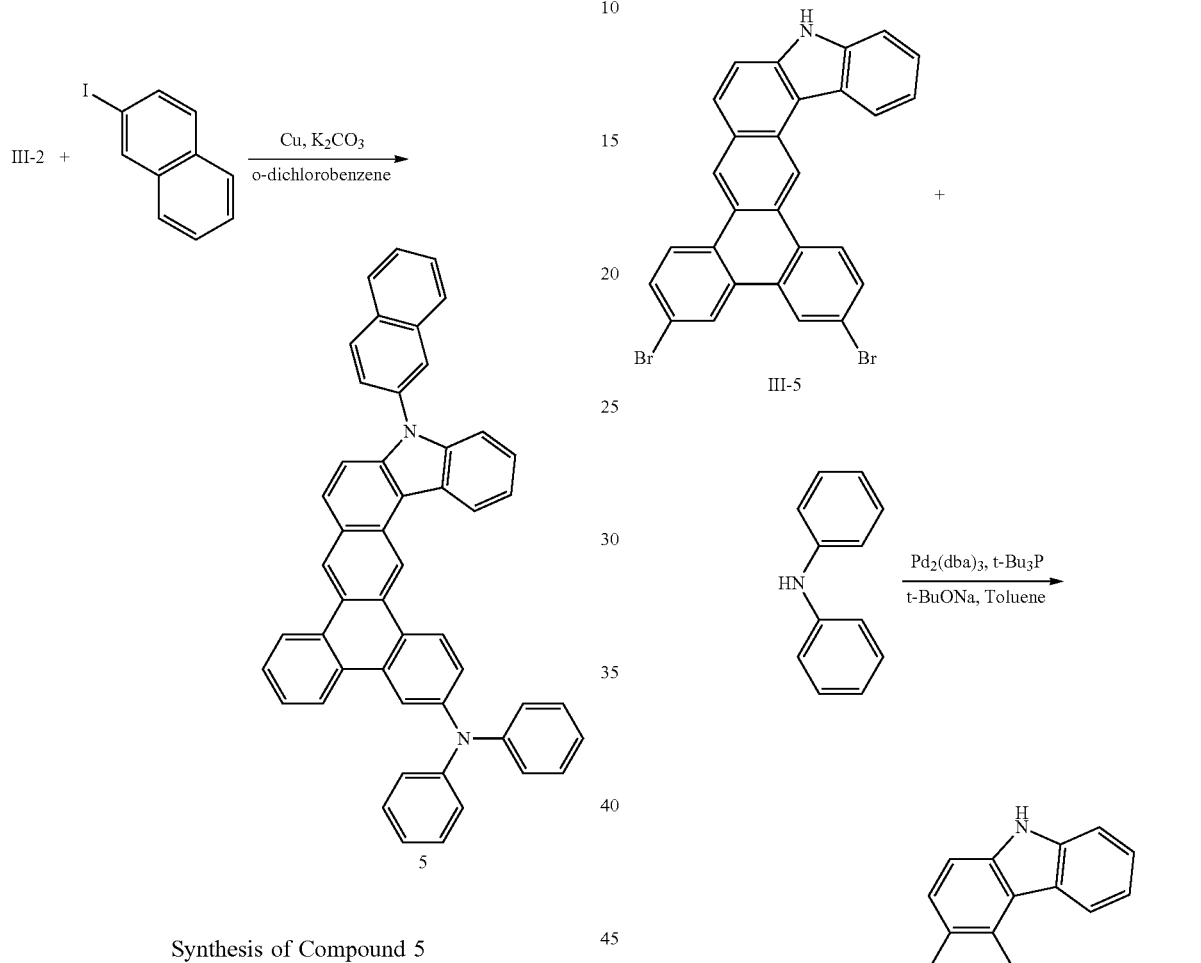

Synthesis of Compound 5

5 g (9.32 mmol) of Intermediate III-2, 2.60 g (10.25 mmol) of 2-iodonaphthalene, 1.78 g (27.95 mmol) of copper powder, and 4.12 g (29.81 mmol) of $K_2CO_3$ were dissolved in 60 ml of o-dichlorobenzene, and the solution was refluxed and agitated at 140° C. for 12 hours. When the reaction was complete, 20 ml of distilled water was added thereto, and the mixture was extracted with ethylacetate. The extracted mixture was dried with magnesium sulfate and filtered, and a solvent therein was evaporation. Then, 3.22 g of Compound 5 (8-(naphthalen-2-yl)-N,N-diphenyl-8H-triphenyleno[2,3-c]carbazol-16-amine) (yield: 56%) was obtained through column chromatography.

$^1$H NMR (300 MHz, $CDCl_3$), d (ppm): 9.09-8.99 (1H, s), 8.75-8.64 (2H, m), 8.47-8.41 (1H, m), 8.40-8.34 (1H, m), 8.32-8.25 (1H, d), 8.25-8.18 (1H, m), 8.12-8.03 (2H, m), 8.03-7.97 (1H, m), 7.96-7.87 (3H, m), 7.80-7.70 (3H, m), 7.69-7.64 (1H, m), 7.64-7.58 (1H, m), 7.57-7.49 (2H, m), 7.29-7.18 (6H, m), 7.16-7.08 (4H, m), 7.01-6.91 (2H, m).

EI-MS, m/e: 660.26 (calculation value), 660.27 (measurement value).

Synthesis Example 3

Synthesis of Compound 13

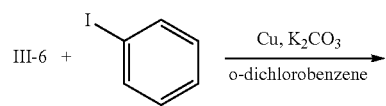

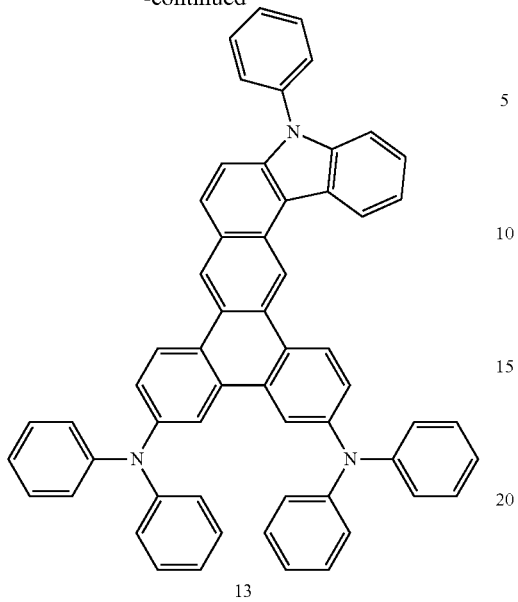

13

Synthesis of Intermediate III-6

86.8 mg (0.09 mmol) of Pd$_2$(dba)$_3$ and 38.37 mg (0.19 mmol) of t-Bu$_3$P were dissolved in 50 ml of o-xylene, and the solution was agitated at room temperature for 10 minutes. 5 g (9.48 mmol) of 2,16-dibromo-8H-triphenyleno[2,3-c]carbazole (Intermediate III-5), 3.21 g (18.97 mmol) of diphenylamine, and 546.84 mg (5.69 mmol) of t-BuONa were added thereto, and the mixture was refluxed and agitated at 160° C. for 48 hours. When the reaction was complete, 20 ml of cold distilled water was added thereto, and the mixture was extracted with ethylacetate. The extracted mixture was dried with magnesium sulfate and filtered, and then, a solvent therein was evaporated. Then, 4.98 g of Intermediate III-6 (N2,N2,N16,N16-tetraphenyl-8H-triphenyleno[2,3-c]carbazole-2,16-diamine) was obtained through column chromatography (yield: 75%).

$^1$H NMR (300 MHz, CDCl$_3$), d (ppm): 9.04-8.96 (1H, s), 8.68-8.60 (2H, m), 8.46-8.37 (2H, m), 8.31-8.25 (1H, d), 8.23-8.18 (1H, d), 8.08-8.02 (1H, m), 7.99-7.92 (1H, m), 7.66-7.55 (3H, m), 7.53-7.46 (1H, m), 7.32-7.16 (11H, m), 7.14-7.05 (8H, m), 7.01-6.92 (4H, m).

EI-MS, m/e: 701.28 (calculation value), 701.27 (measurement value).

Synthesis of Compound 13

5 g (7.10 mmol) of Intermediate III-6, 1.59 g (7.81 mmol) of iodobenzene, 1.35 g (21.31 mmol) of copper powder, and 3.14 g (22.73 mmol) of K$_2$CO$_3$ were dissolved in 60 ml of o-dichlorobenzene, and the solution was refluxed and agitated at 140° C. for 12 hours. When the reaction was complete, 20 ml of distilled water was added thereto, and the mixture was extracted with ethylacetate. The extracted mixture was dried with magnesium sulfate and filtered, and a solvent therein was evaporated. Then, 3.22 g of Compound 13 (N2,N2,N16,N16,8-pentaphenyl-8H-triphenyleno[2,3-c]carbazole-2,16-diamine) (yield: 58%) was obtained through column chromatography.

$^1$H NMR (300 MHz, CDCl$_3$), d (ppm): 9.08-9.00 (1H, s), 8.69-8.63 (1H, m), 8.46-8.37 (2H, m), 8.32-8.24 (1H, d), 8.24-8.17 (1H, d), 8.10-8.04 (1H, m), 8.02-7.96 (1H, m), 7.77-7.71 (1H, d), 7.65-7.55 (5H, m), 7.49-7.41 (2H, m), 7.32-7.18 (11H, m), 7.15-7.06 (8H, m), 7.02-6.91 (4H, m).

EI-MS, m/e: 777.31 (calculation value), 777.33 (measurement value).

Synthesis Example 4

Synthesis of Compound 14

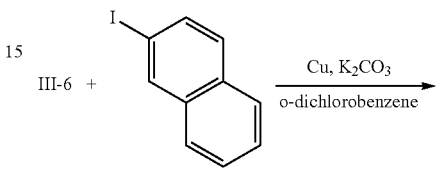

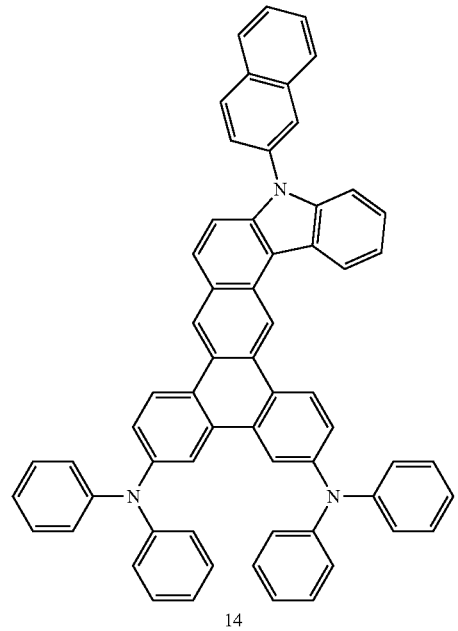

14

Synthesis of Compound 14

5 g (7.10 mmol) of Intermediate III-6, 1.99 g (7.81 mmol) of 2-iodonaphthalene, 1.35 g (21.31 mmol) of copper powder, and 3.14 g (22.73 mmol) of K$_2$CO$_3$ were dissolved in 60 ml of o-dichlorobenzene, and the solution was refluxed and agitated at 140° C. for 12 hours. When the reaction was complete, 20 ml of distilled water was added thereto, and the mixture was extracted with ethylacetate. The extracted mixture was dried with magnesium sulfate and filtered, and a solvent therein was evaporated. Then, 3.32 g of Compound 14 (8-(naphthalen-2-yl)-N2,N2,N16,N16-tetraphenyl-8H-triphenyleno[2,3-c]carbazole-2,16-diamine) (yield: 56%) was obtained through column chromatography.

$^1$H NMR (300 MHz, CDCl$_3$), d (ppm): 9.31-9.23 (1H, s), 8.68-8.61 (1H, m), 8.35-8.26 (2H, m), 8.24-8.17 (1H, d), 8.13-8.08 (1H, m), 8.07-8.01 (1H, m), 7.98-7.86 (3H, m), 7.85-7.80 (2H, m), 7.79-7.73 (1H, d), 7.64-7.57 (2H, m), 7.56-7.42 (4H, m), 7.29-7.13 (18H, m), 7.03-6.92 (4H, m).

EI-MS, m/e: 827.33 (calculation value), 827.31 (measurement value).

Compounds other than the above compounds may be synthesized by those of ordinary skill in the art with reference to the above-described processes and raw materials.

EXAMPLES

Example 1

An anode was manufactured by cutting a 15 Ω/cm² (1200 Å) ITO glass substrate made by Corning Inc. into a size of 50 mm×50 mm×0.7 mm, ultrasonic wave-cleaning it by using isopropyl alcohol and pure water respectively for 5 minutes, radiating it with an ultraviolet (UV) ray for 30 minutes, exposing it to ozone, and mounting the resulting glass substrate in a vacuum deposition device. On the resulting substrate, a 600 Å-thick hole injection layer (HIL) was formed by vacuum-depositing 4,4′,4″-tris(N-(2-naphthyl)-N-phenyl-amino)-triphenylamine (hereinafter 2-TNATA), followed by forming a 300 Å thick hole transport layer (HTL) by vacuum-depositing 4,4′-bis[N-(1-naphthyl)-N-phenylamino]biphenyl (hereinafter NPB) as a hole transport compound. On the hole transport layer (HTL), a 300 Å thick emission layer was formed by simultaneously depositing Compound 1 and bis-(1-phenylisoquinolyl) iridium (Ill) acetylacetonate (hereinafter (piq)₂Ir(acac)) in a weight ratio of 87:13. A 300 Å thick electron transport layer (ETL) was then formed on the emission layer by depositing tris-(8-hydroxyquinoline)aluminum (hereinafter Alq3). A LiF/Al electrode was then formed on the electron transport layer (ETL) by forming a 10 Å-thick electron injection layer (EEL) through deposition of a halogenated alkaline metal, LiF and a 3000 Å-thick cathode electrode through vacuum-deposition of Al, thus manufacturing an organic light emitting diode device.

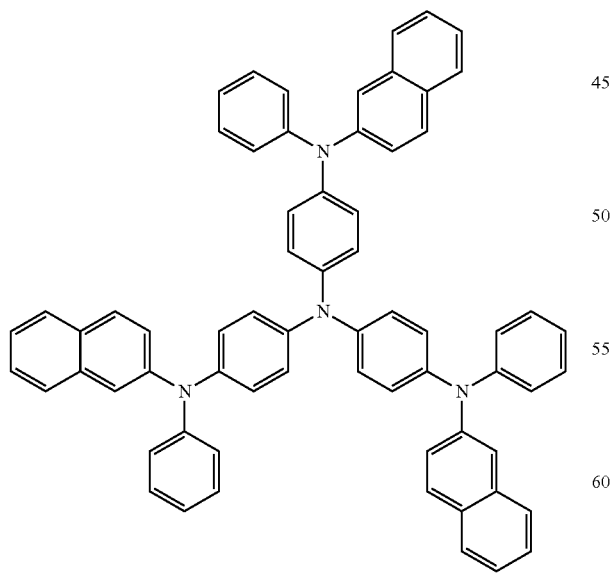

2-TNATA

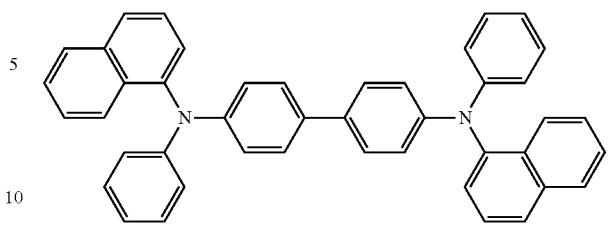

NPB

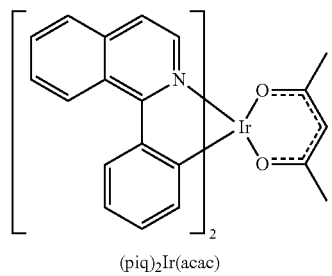

(piq)₂Ir(acac)

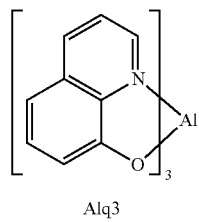

Alq3

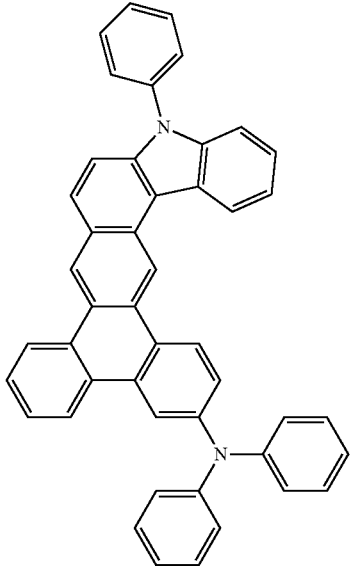

Compound 1

Example 2

An organic light emitting diode device was manufactured as in Example 1 except for using Compound 5 instead of Compound 1 to form the emission layer.

Compound 5

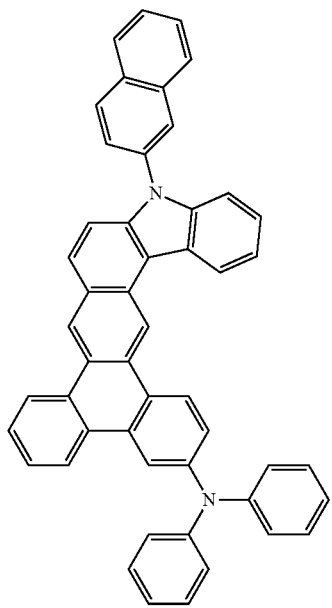

Example 3

An organic light emitting diode device was manufactured as in Example 1 except for using Compound 10 instead of Compound 1 to form the emission layer.

Compound 10

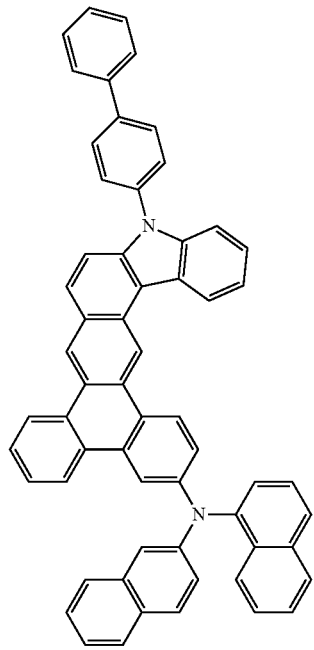

Example 4

An organic light emitting diode device was manufactured as in Example 1 except for using Compound 13 instead of Compound 1 to form the emission layer.

Compound 13

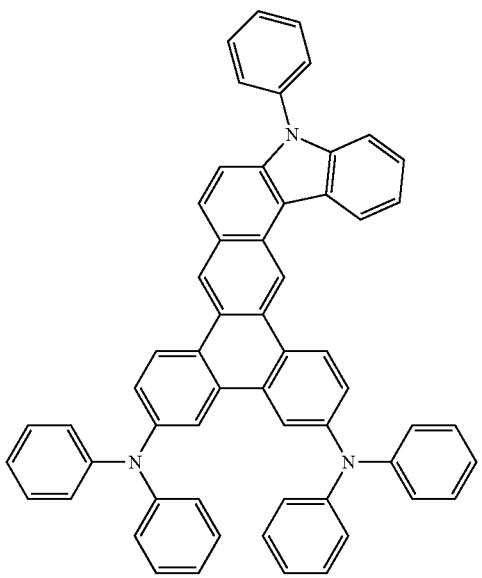

Example 5

An organic light emitting diode device was manufactured as in Example 1 except for using Compound 17 instead of Compound 1 and tris(2-phenylpyridine)iridium (hereinafter Ir(ppy)$_3$) instead of (piq)$_2$Ir(acac) to form the emission layer.

Compound 17

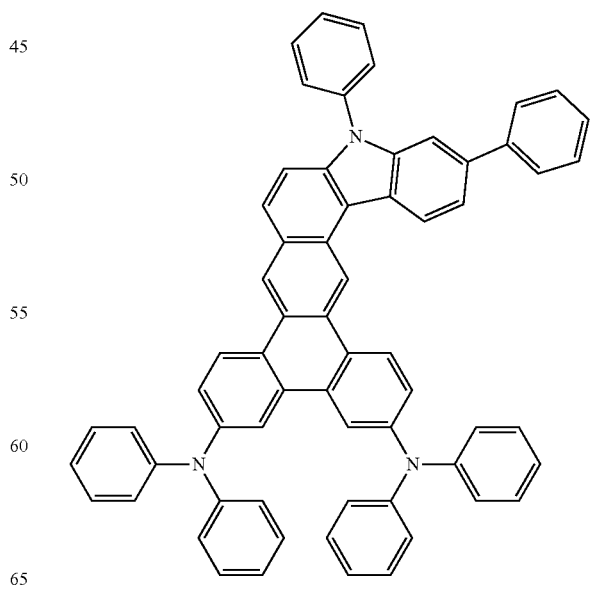

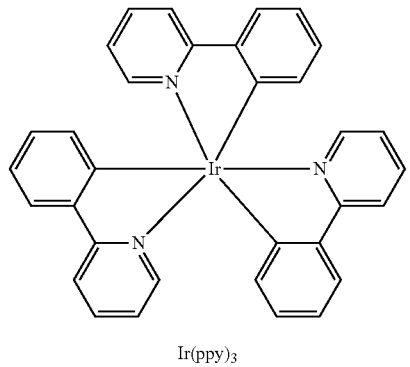

Ir(ppy)₃

Example 6

An organic light emitting diode device was manufactured as in Example 5 except for using Compound 21 instead of Compound 17 to form the emission layer.

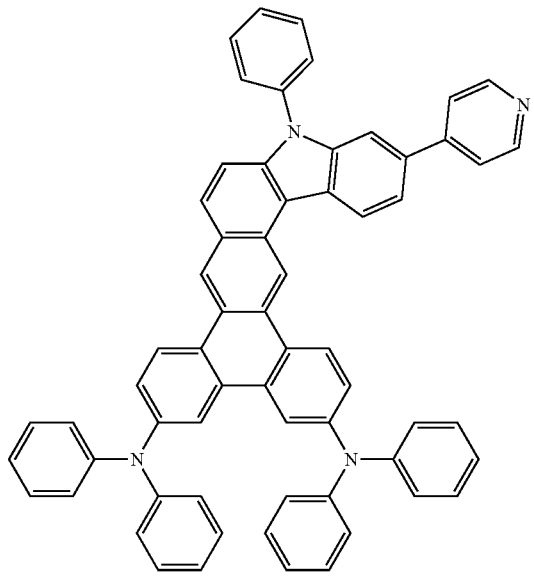

Compound 21

Example 7

An organic light emitting diode device was manufactured as in Example 5 except for using Compound 27 instead of Compound 17 to form the emission layer.

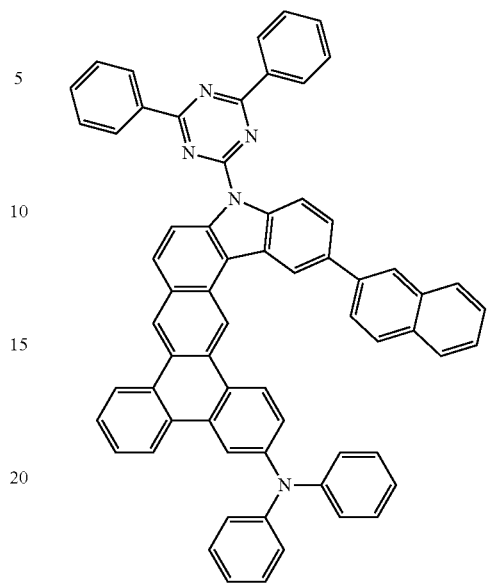

Compound 27

Example 8

An organic light emitting diode device was manufactured as in Example 5 except for using Compound 31 instead of Compound 17 to form the emission layer.

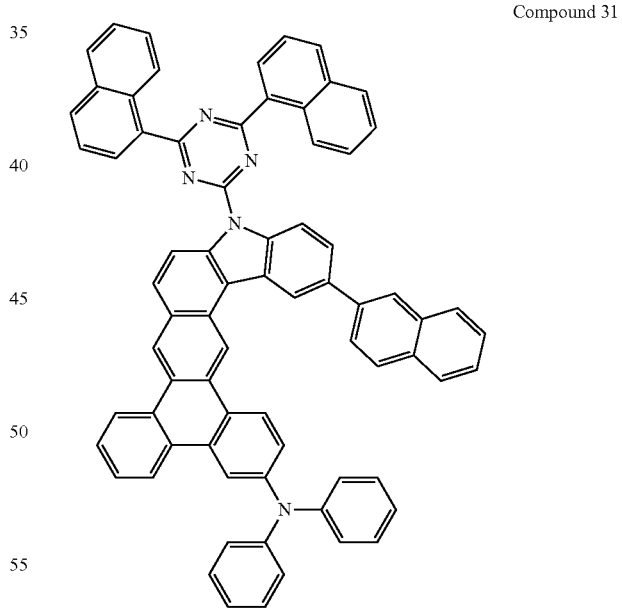

Compound 31

Example 9

An organic light emitting diode device was manufactured as in Example 1 except for using 9,10-di-naphthalene-2-yl-anthracene (hereinafter ADN) instead of Compound 1 and 1,4-bis-(2,2-diphenylvinyl)biphenyl (hereinafter DPVBi) instead of (piq)₂Ir(acac), and simultaneously depositing ADN and DPVBi in a weight ratio of 98:2 to form the emission layer, and using Compound 37 instead of Alq3 to form the electron transport layer (ETL).

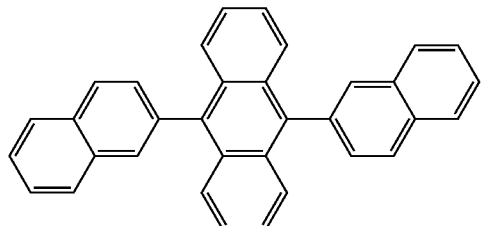

ADN

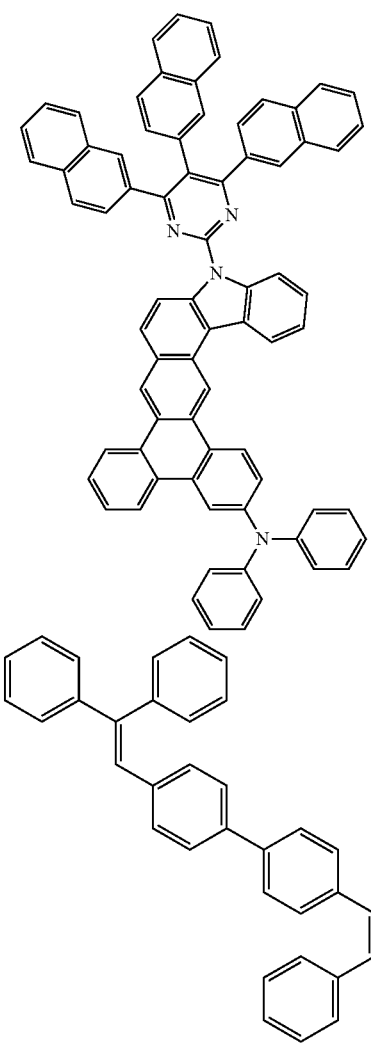

Compound 37

DPVBi

Example 10

An organic light emitting diode device was manufactured as in Example 9 except for using Compound 41 instead of Compound 37 to form the electron transport layer (ETL).

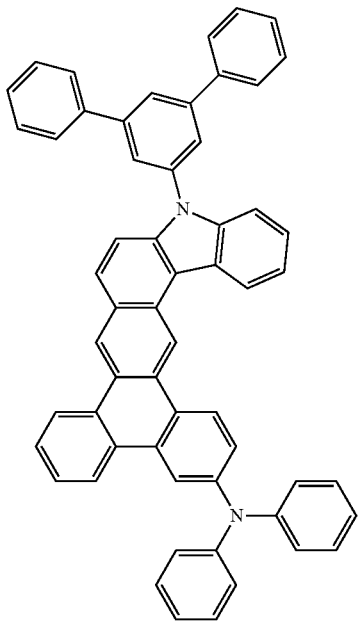

Compound 41

Example 11

An organic light emitting diode device was manufactured as in Example 9 except for using Alq3 instead of Compound 37 to form the electron transport layer (ETL) and Compound 49 instead of NPB to form the hole transport layer (HTL).

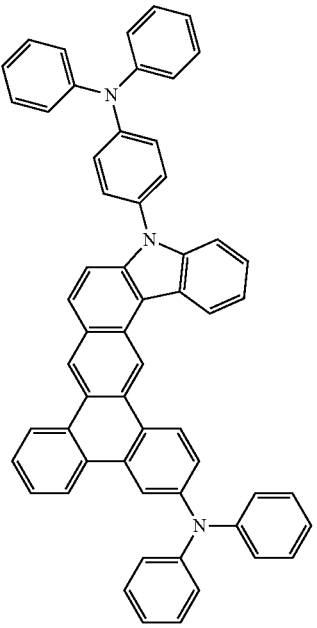

Compound 49

Example 12

An organic light emitting diode device was manufactured as in Example 11 except for using Compound 50 instead of Compound 49 to form the hole transport layer (HTL).

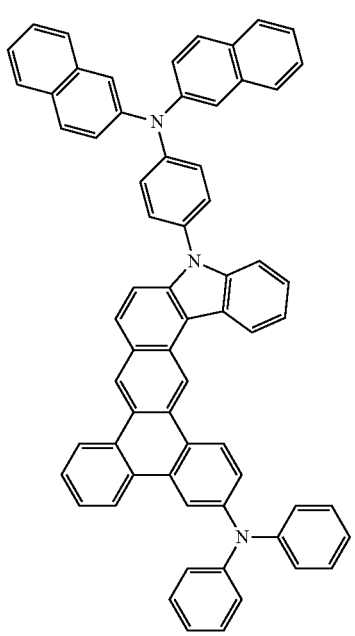

Comparative Example 1

An organic light emitting diode device was manufactured as in Example 1 except for using 4,4'-Bis(carbazol-9-yl)biphenyl (hereinafter CBP) instead of Compound 1 to form the emission layer.

Compound 50

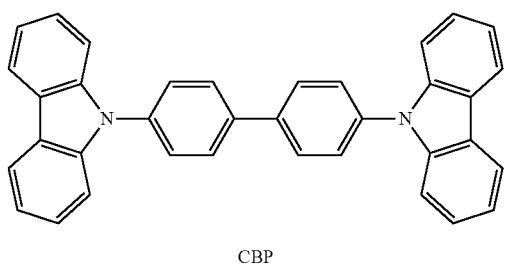 [SMILES: c1ccc2c(c1)c1ccccc1n2-c1ccc(-c2ccc(-n3c4ccccc4c4ccccc43)cc2)cc1 ; "CBP"]

CBP

Comparative Example 2

An organic light emitting diode device was manufactured as in Example 5 except for using CBP instead of Compound 17 to form the emission layer.

Comparative Example 3

An organic light emitting diode device was manufactured as in Example 9 except for using Alq3 instead of Compound 37 to form the electron transport layer (ETL).

Comparative Example 4

An organic light emitting diode device was manufactured as in Example 12 except for using NPB instead of Compound 50 to form the hole transport layer (HTL).

Evaluation

The characteristics of organic light emitting diode devices obtained from Examples 1 to 12 and Comparative Examples 1 to 4 were evaluated.

The results are shown in Table 1.

TABLE 1

| | Light emitting material or electron transport material or hole transport material | Driving voltage (V) | Current density (mA/cm$^2$) | Luminance (cd/mm$^2$) | Efficiency (cd/A) | Light emitting color | Half-life span (hr @100 mA/cm$^2$) |
|---|---|---|---|---|---|---|---|
| Example 1 | Compound 1 (light emitting material) | 6.2 | 6.3 | 1000 | 16.2 | red | 637 |
| Example 2 | Compound 5 (light emitting material) | 6.6 | 5.7 | 1000 | 17.8 | red | 620 |
| Example 3 | Compound 10 (light emitting material) | 6.1 | 5.6 | 1000 | 18.2 | red | 641 |
| Example 4 | Compound 13 (light emitting material) | 5.9 | 5.7 | 1000 | 18.0 | red | 598 |
| Example 5 | Compound 17 (light emitting material) | 5.3 | 4.4 | 1000 | 23.4 | green | 341 |
| Example 6 | Compound 21 (light emitting material) | 5.8 | 4.1 | 1000 | 25.2 | green | 325 |
| Example 7 | Compound 27 (light emitting material) | 5.1 | 3.9 | 1000 | 26.4 | green | 357 |
| Example 8 | Compound 31 (light emitting material) | 5.4 | 4.2 | 1000 | 24.3 | green | 298 |
| Example 9 | Compound 37 (electron transport material) | 6.6 | 50 | 2532 | 4.9 | blue | 292 |
| Example 10 | Compound 41 (electron transport material) | 6.1 | 50 | 2254 | 4.5 | blue | 248 |
| Example 11 | Compound 49 (hole transport material) | 6.4 | 50 | 2510 | 4.7 | blue | 291 |
| Example 12 | Compound 50 (hole transport material) | 6.3 | 50 | 2451 | 4.9 | blue | 280 |
| Comparative Example 1 | CBP (light emitting material) | 7.5 | 9.2 | 1000 | 11.1 | red | 354 |
| Comparative Example 2 | CBP (light emitting material) | 7.4 | 5.9 | 1000 | 17.6 | green | 189 |
| Comparative Example 3 | Alq3 (electron transport material) | 7.8 | 50 | 1645 | 3.3 | blue | 142 |

TABLE 1-continued

| | Light emitting material or electron transport material or hole transport material | Driving voltage (V) | Current density (mA/cm$^2$) | Luminance (cd/mm$^2$) | Efficiency (cd/A) | Light emitting color | Half-life span (hr @100 mA/cm$^2$) |
|---|---|---|---|---|---|---|---|
| Comparative Example 4 | NPB (hole transport material) | 7.9 | 50 | 1710 | 3.4 | blue | 134 |

Referring to Table 1, the organic light emitting diode devices according to Examples 1 to 4 showed improved driving voltage and efficiency characteristics compared with the organic light emitting diode device according to Comparative Example 1, the organic light emitting diode devices according to Examples 5 to 8 showed improved driving voltage and efficiency characteristics compared with the organic light emitting diode device according to Comparative Example 2, the organic light emitting diode devices according to Examples 9 and 10 showed improved driving voltage, luminance, efficiency and life-span characteristics compared with the organic light emitting diode device according to Comparative Example 3, and the organic light emitting diode devices according to Examples 11 and 12 showed improved driving voltage, luminance, efficiency and life-span characteristics compared with the organic light emitting diode device according to Comparative Example 4.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims and equivalents thereof. Therefore, the aforementioned embodiments should be understood to be exemplary but not limiting this disclosure in any way.

DESCRIPTION OF SYMBOLS

1: anode
2: cathode
3: hole auxiliary layer
4: electron auxiliary layer
5: emission layer
10: organic layer

What is claimed is:

1. A compound represented by Chemical Formula 1:

Chemical Formula 1

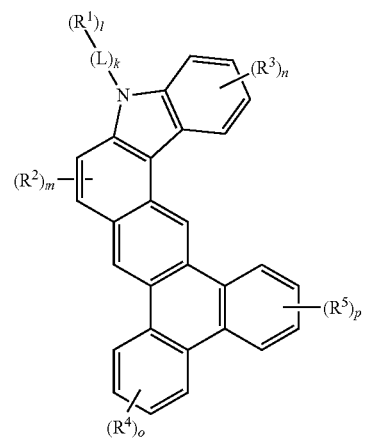

wherein $R^1$ to $R^5$ are each independently hydrogen, deuterium, a halogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C1 to C30 alkoxy group, a substituted or unsubstituted C6 to C30 aryloxy group, a substituted or unsubstituted C6 to C30 arylthiol group, a substituted or unsubstituted C6 to C30 aryl group, a substituted or unsubstituted C2 to C30 heteroaryl group, a substituted or unsubstituted C1 to C30 amine group, a substituted or unsubstituted silyl group, a cyano group, a nitro group, a hydroxy group, a carboxyl group, or a combination thereof, L is a substituted or unsubstituted C1 to C30 alkylene group, a substituted or unsubstituted C6 to C30 arylene group, a substituted or unsubstituted C2 to C30 heteroarylene group, or a combination thereof, k is an integer from 0 to 2, l is an integer from 1 to 3, m is an integer from 0 to 2, and n, o, and p are each independently integers from 0 to 4, and o and p are not simultaneously 0.

2. The compound of claim 1, wherein at least one of $R^4$ and $R^5$ is a substituted or unsubstituted C1 to C30 amine group.

3. The compound of claim 1, wherein at least one of $R^4$ and $R^5$ is a C1 to C30 amine group substituted with an aryl group.

4. The compound of claim 1, wherein m is 0.

5. The compound of claim 1, wherein $R^1$ and $R^3$ are each independently a substituted or unsubstituted C6 to C30 aryl group, a substituted or unsubstituted C2 to C30 heteroaryl group, or a substituted or unsubstituted C1 to C30 amine group.

6. The compound of claim 1, wherein $R^3$ is a substituted or unsubstituted phenyl group, a substituted or unsubstituted biphenyl group, a substituted or unsubstituted naphthyl group, a substituted or unsubstituted anthracenyl group, a substituted or unsubstituted phenanthrenyl group, a substituted or unsubstituted pyridinyl group, a substituted or unsubstituted pyrimidinyl group, a substituted or unsubstituted triazinyl group, a substituted or unsubstituted quinolinyl group, or a substituted or unsubstituted isoquinolinyl group.

7. The compound of claim 1, wherein L is a substituted or unsubstituted C6 to C30 arylene group or a substituted or unsubstituted C2 to C30 heteroarylene group.

8. The compound of claim 1, wherein the compound represented by Chemical Formula 1 comprises at least one selected from Compounds 1-52:

1
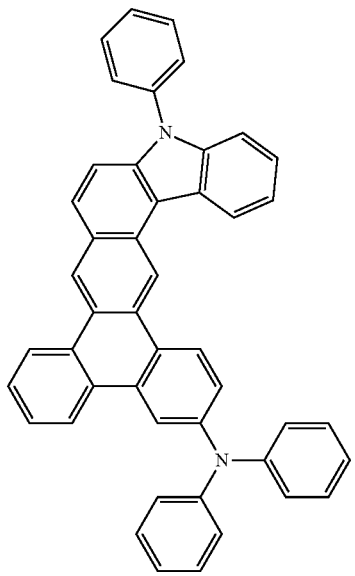
2
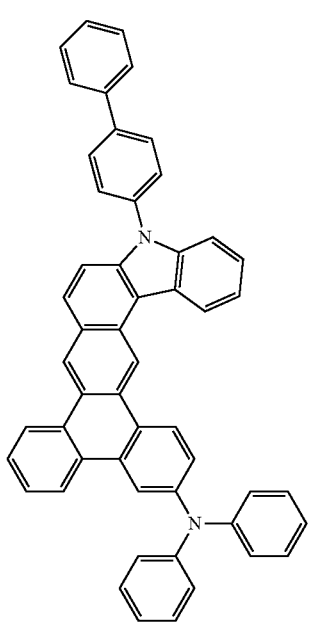
3
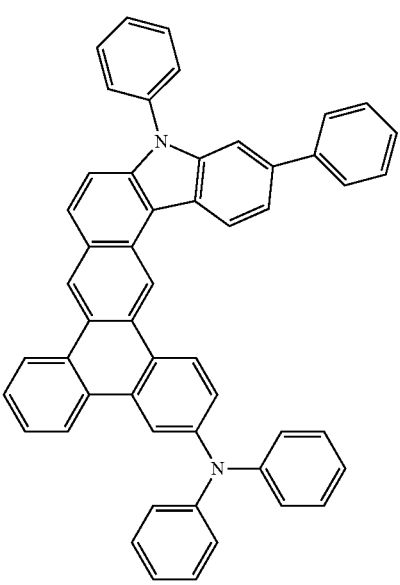
4
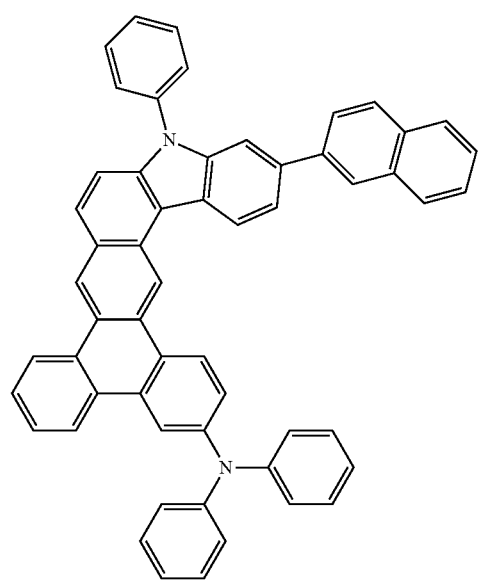

5
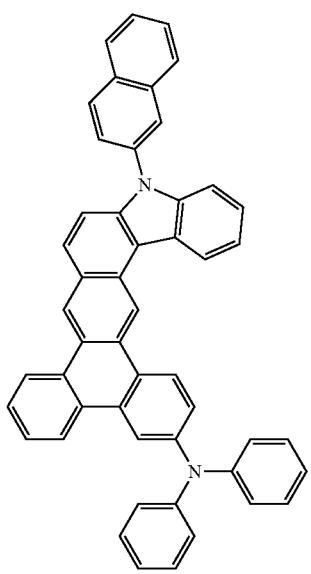
6
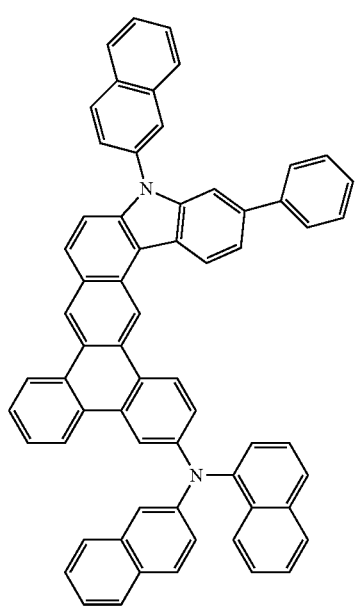
7
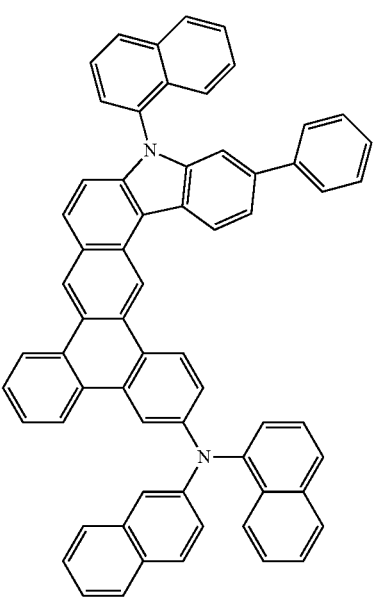
8
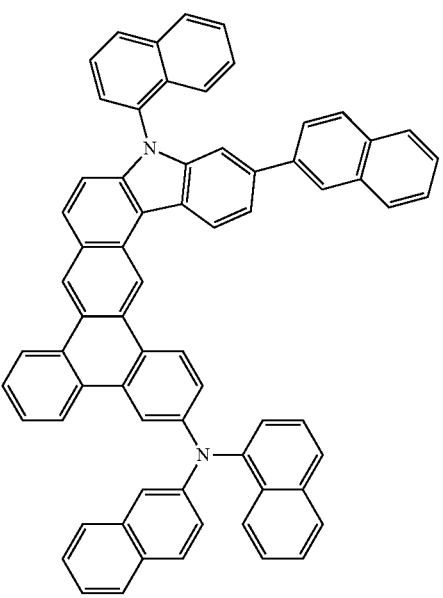

9
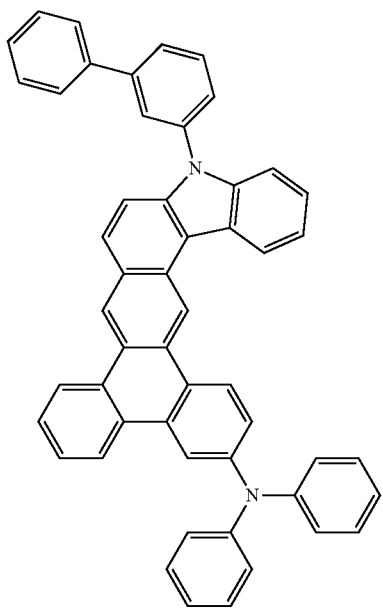
10
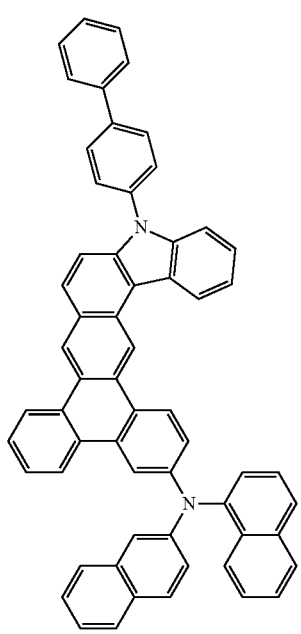
5
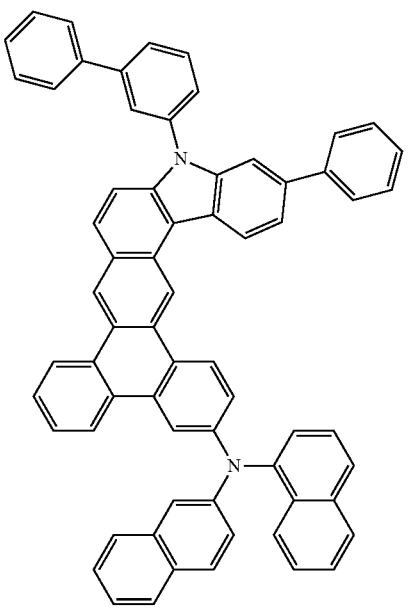
11
12
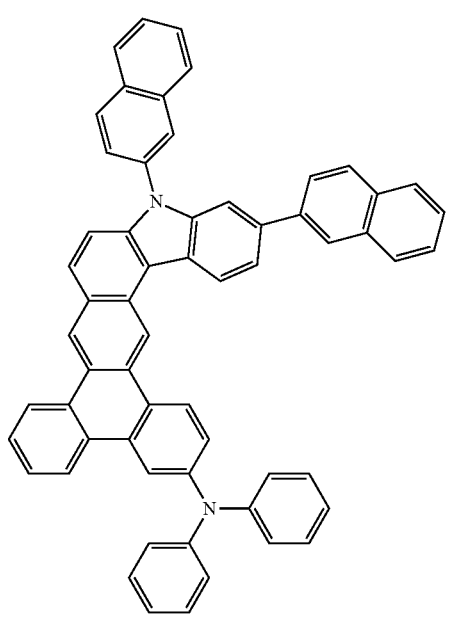

13
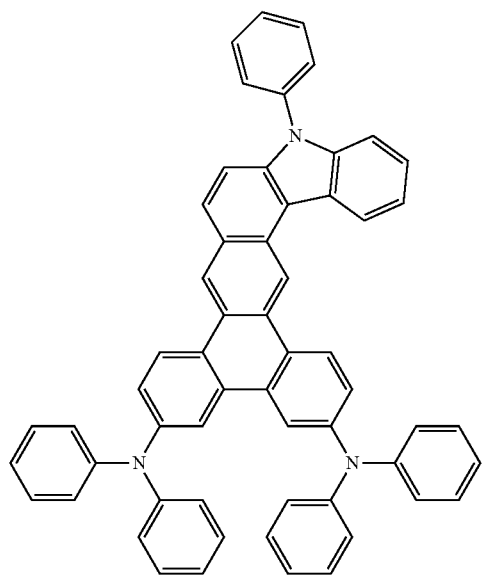
14
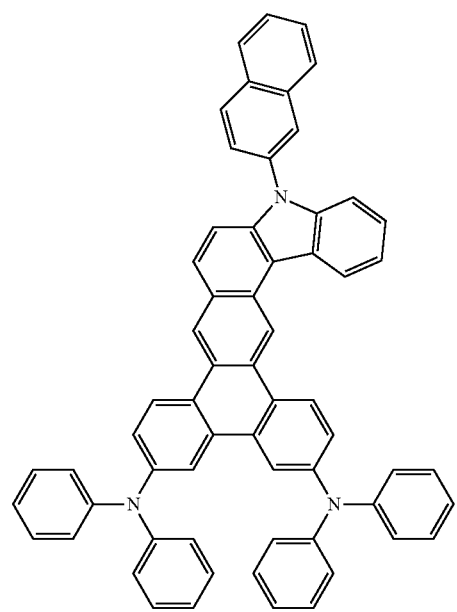
15
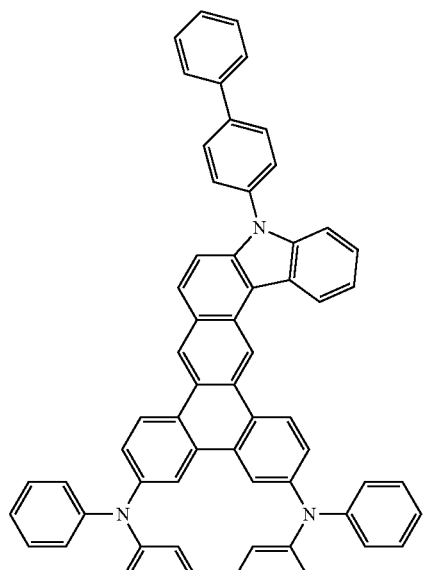
16

17
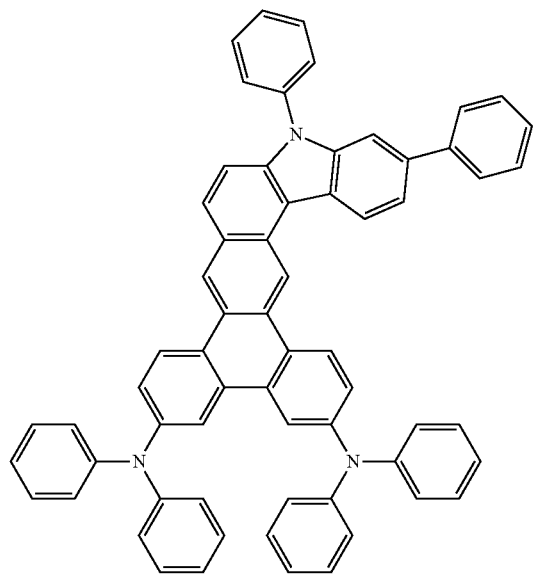
18
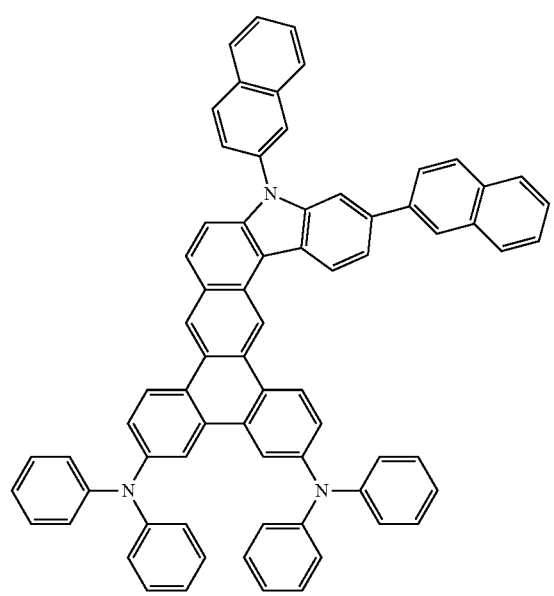
19
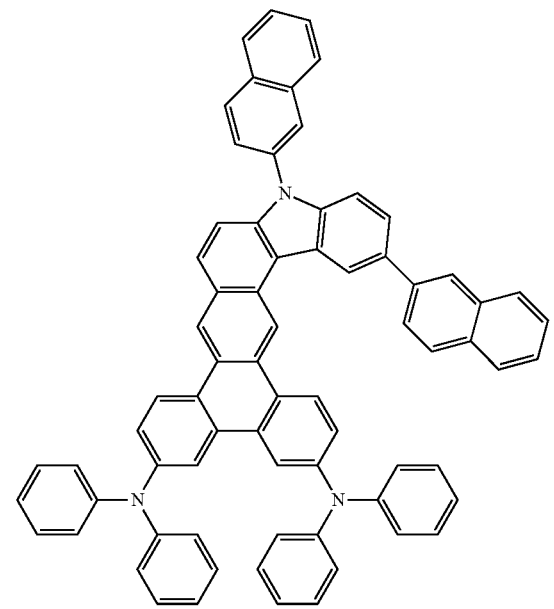
20
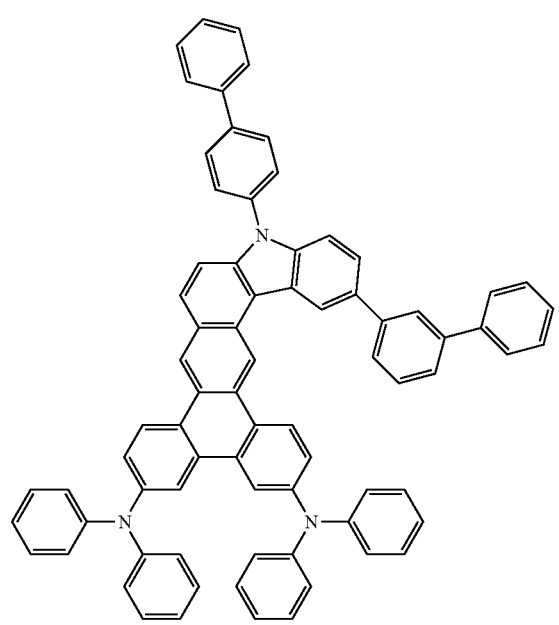

-continued
21
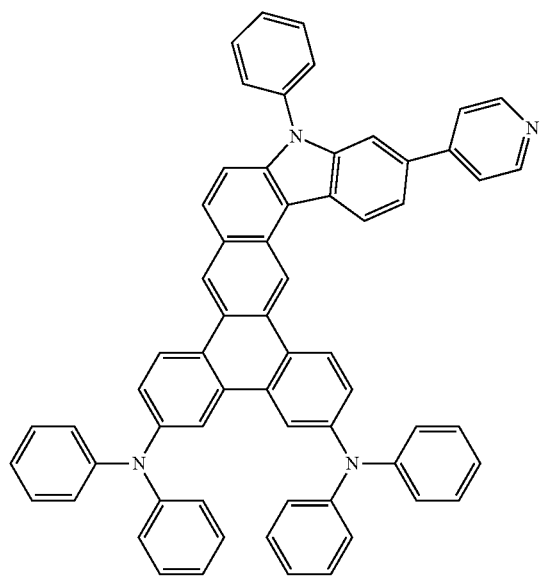
22
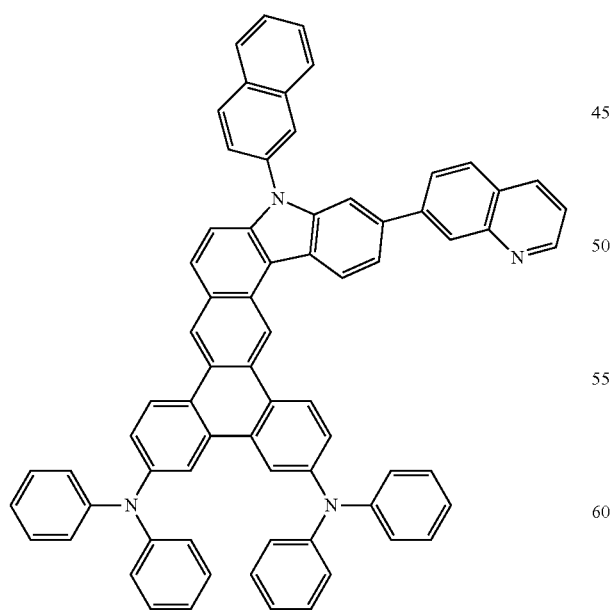
-continued
23
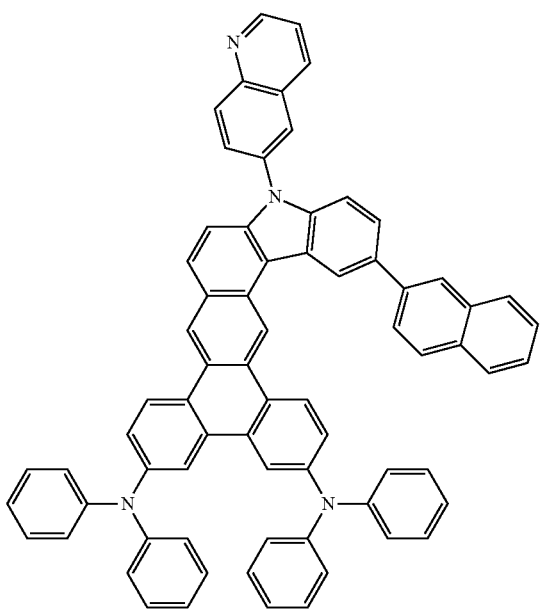
24
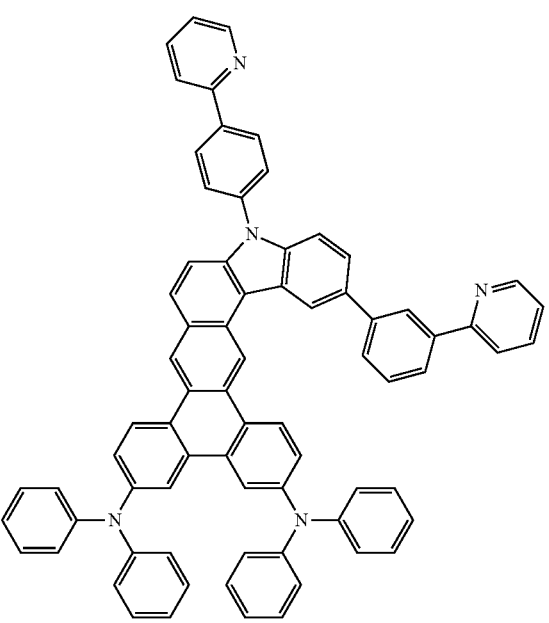

25
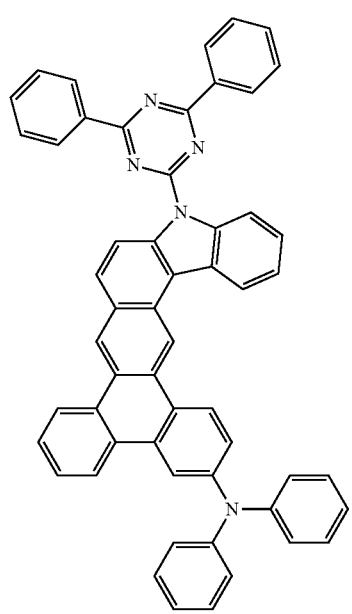
26
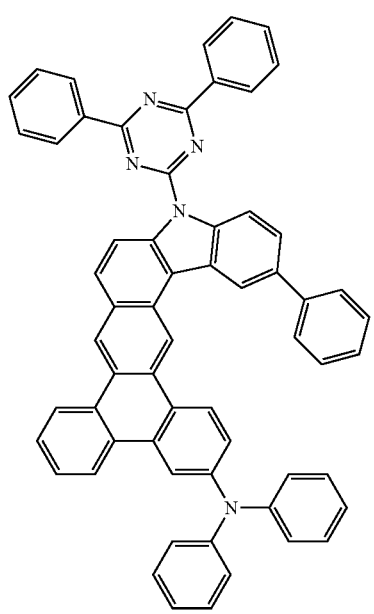
27
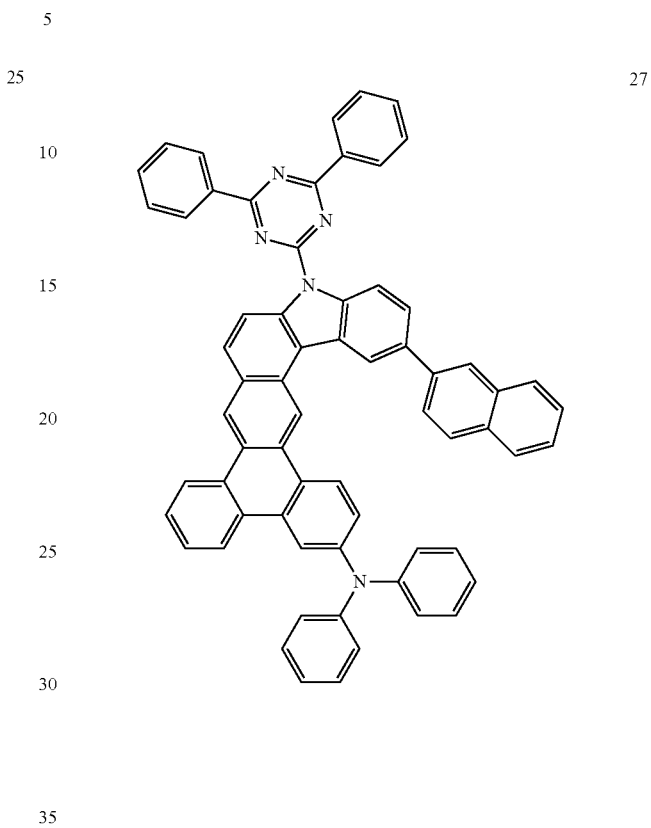
28
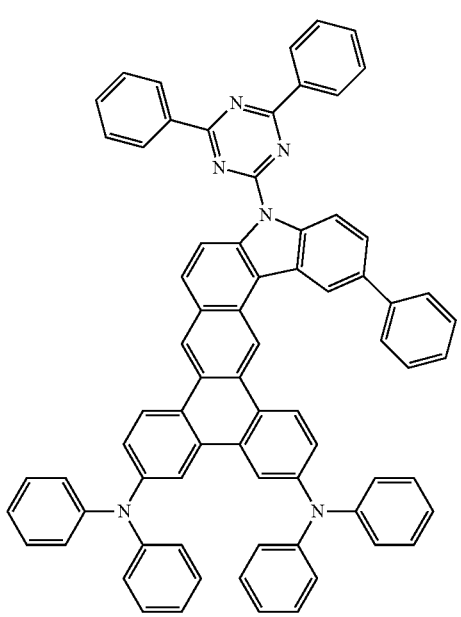

29
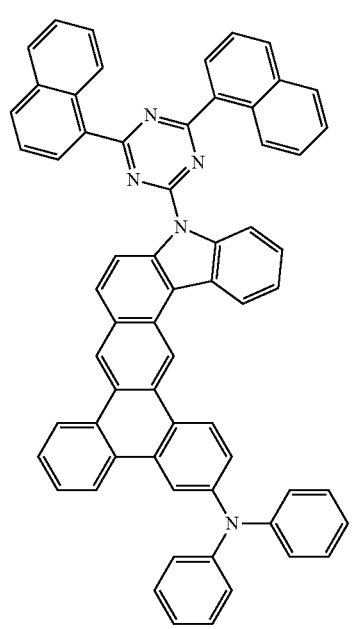
30
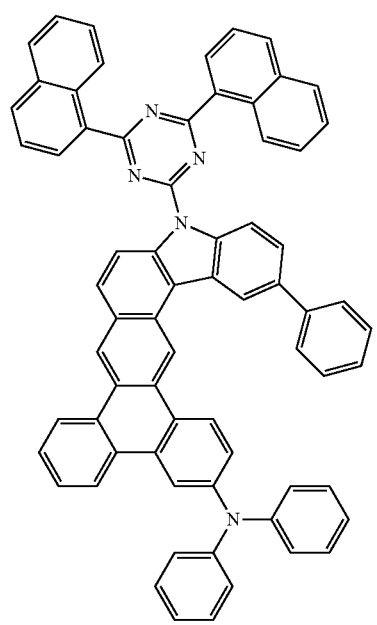
31
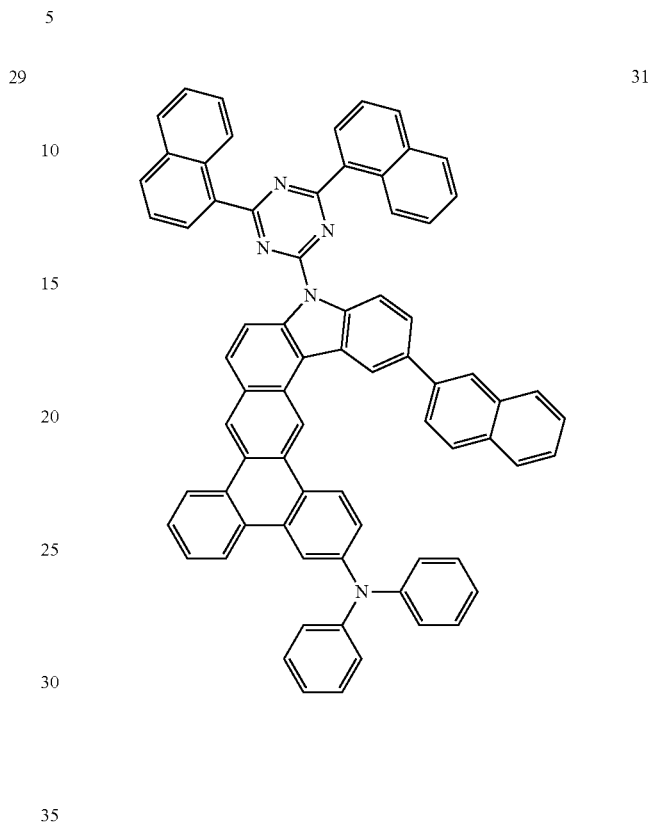
32
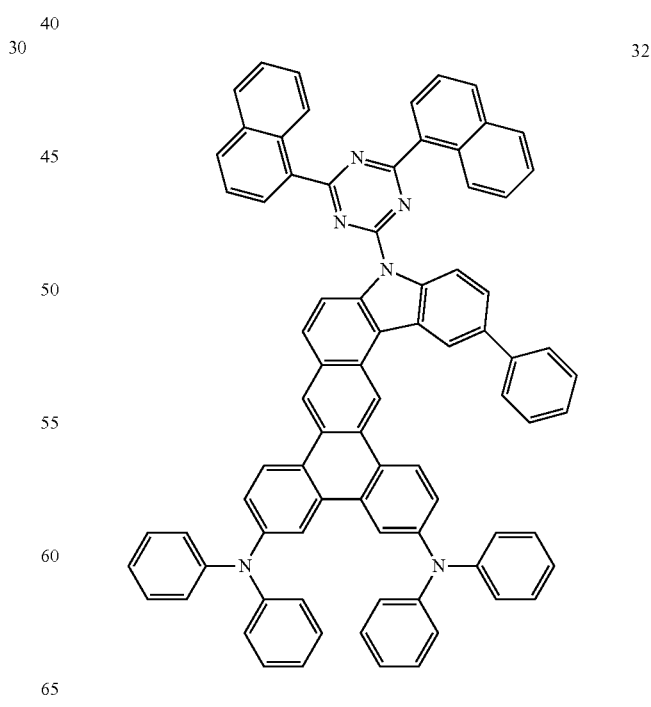

33
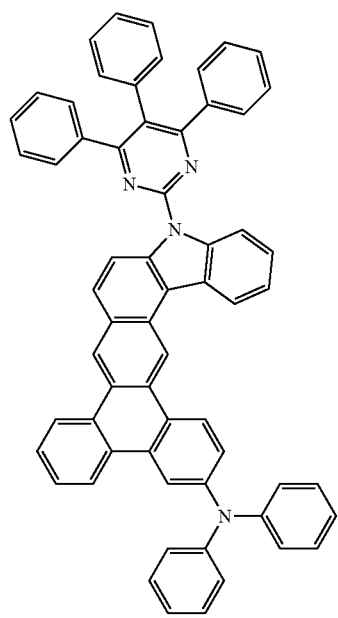
35
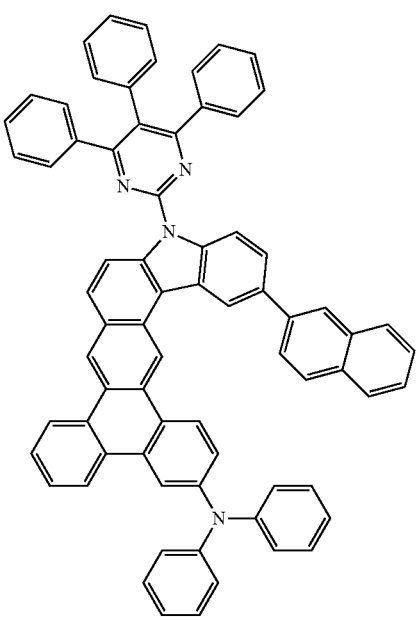
34
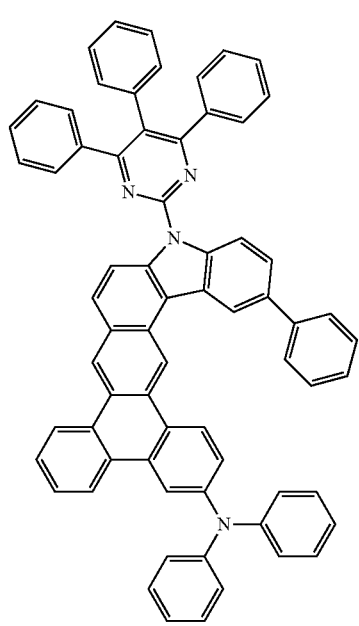
36
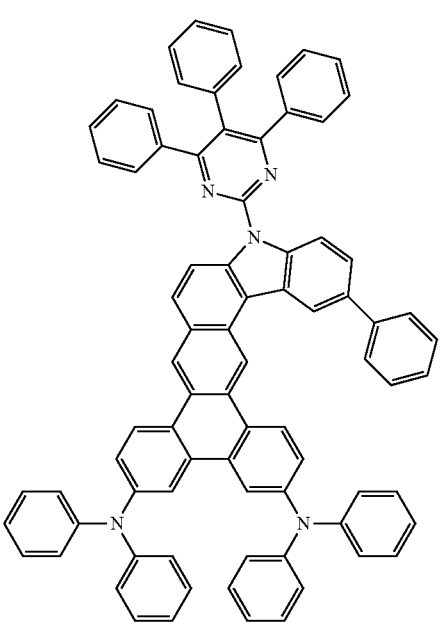

37
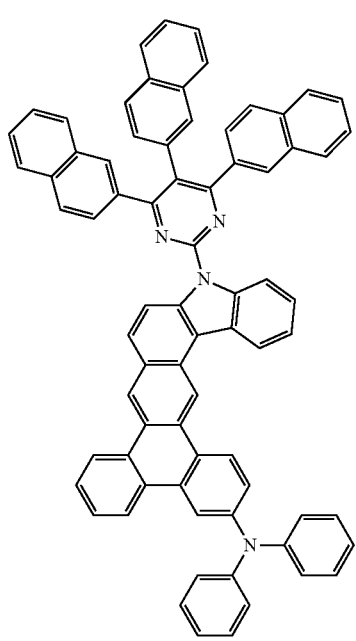
38
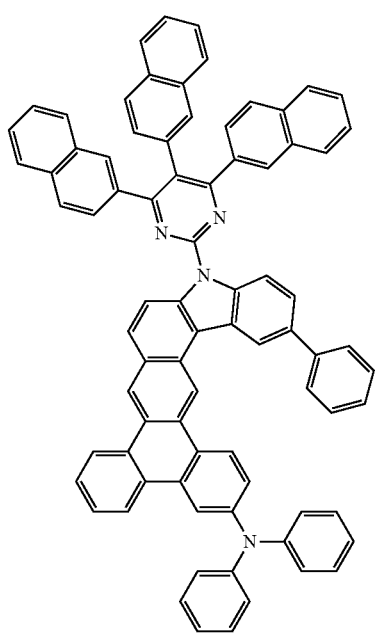
39
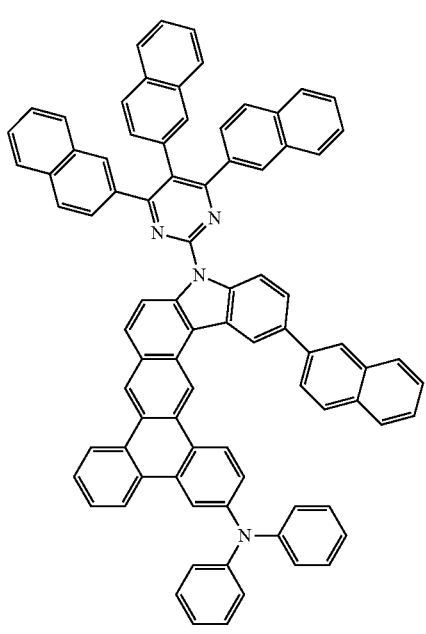
40

81
-continued
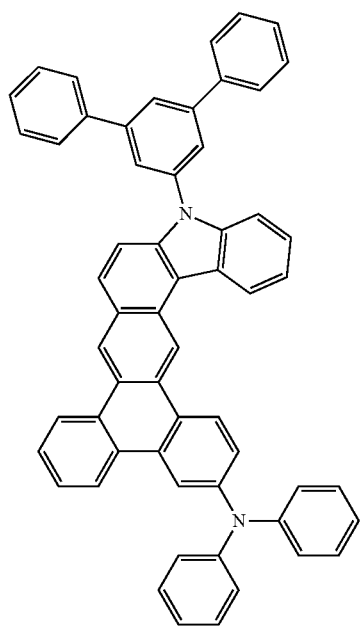
82
-continued
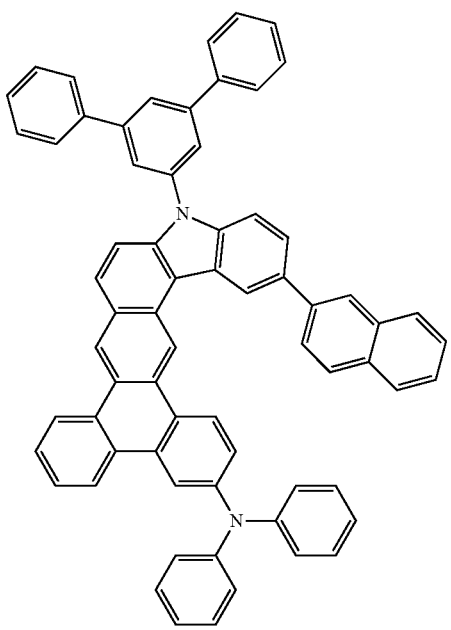
41
43
42
44
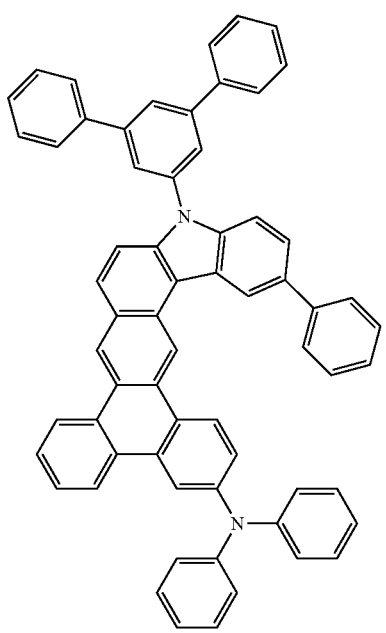
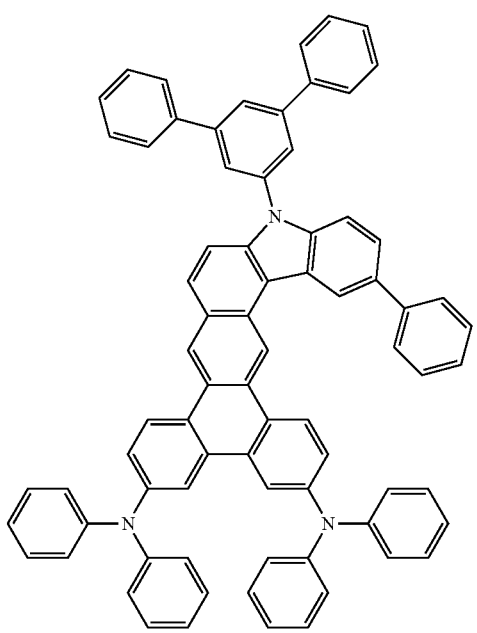

83
-continued
45
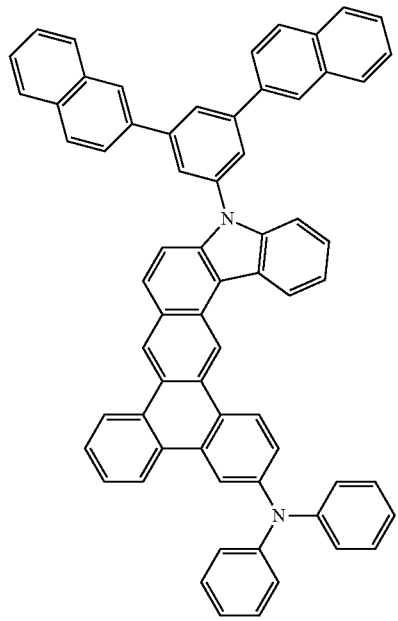
46
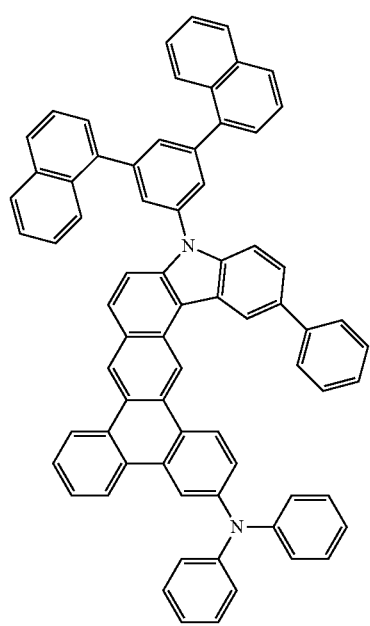
84
-continued
47
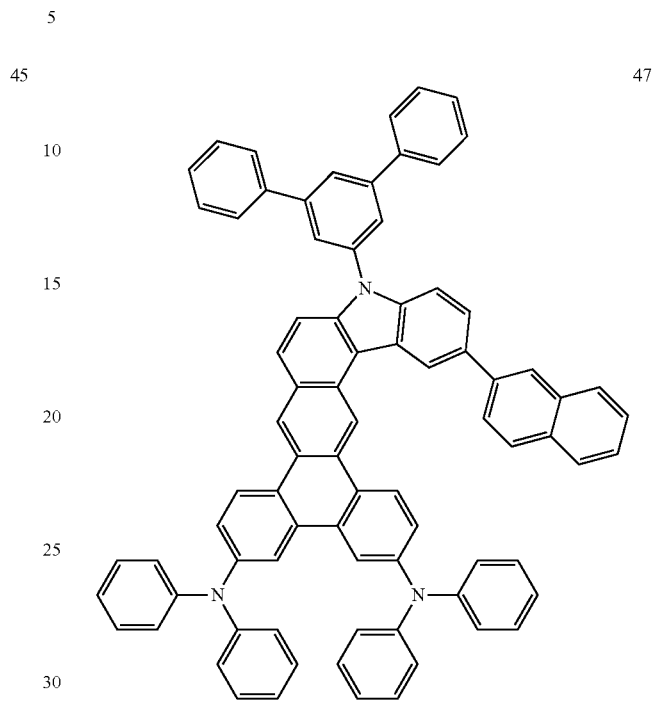
48
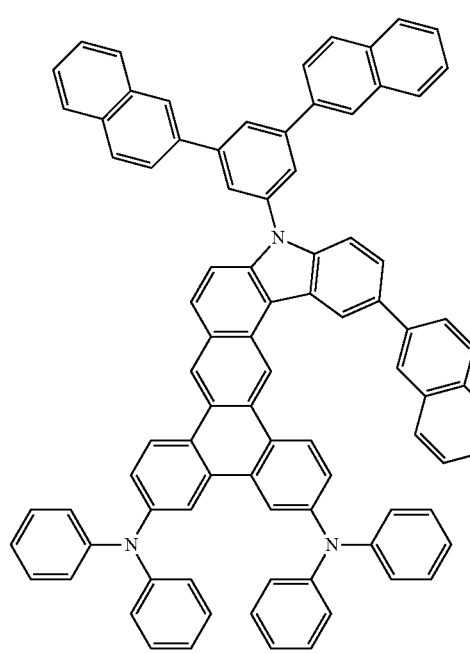

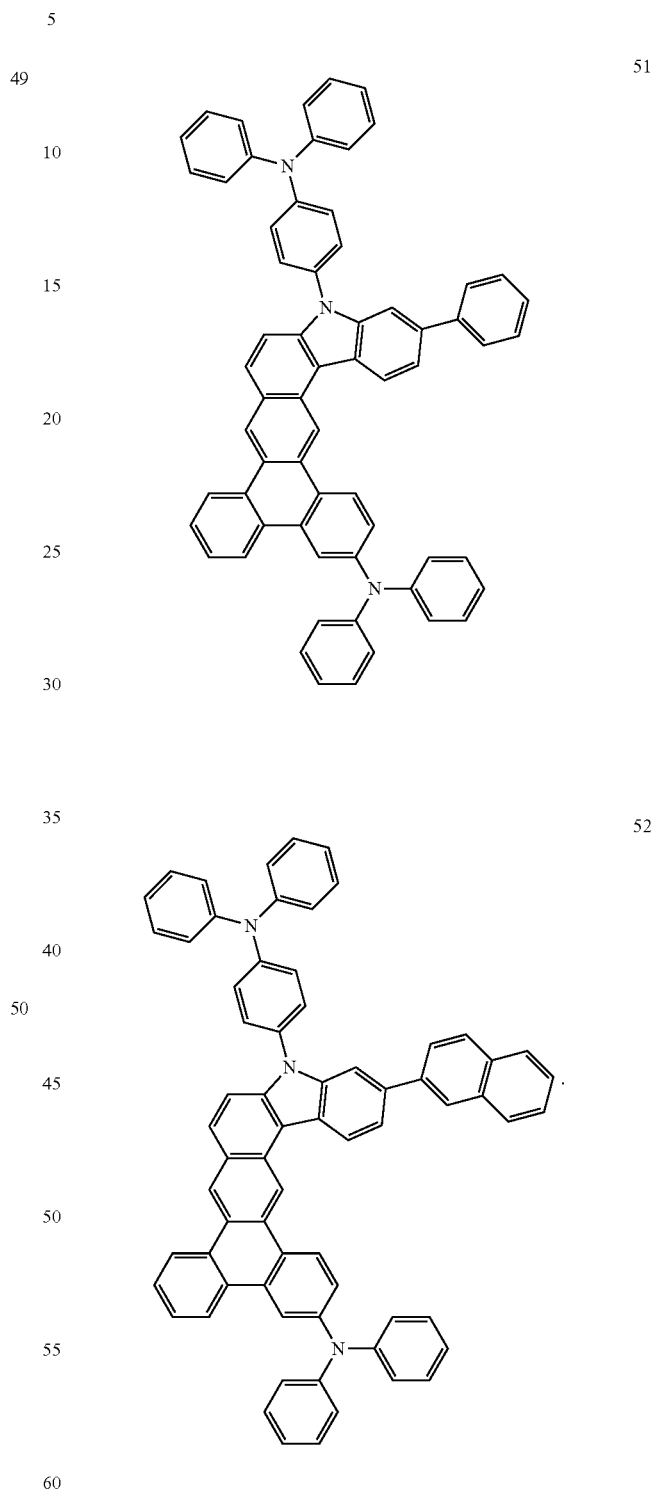
9. An organic light emitting diode device comprising
an anode;
a cathode; and
an organic layer between the anode and the cathode, the organic layer comprising a compound represented by Chemical Formula 1:

Chemical Formula 1

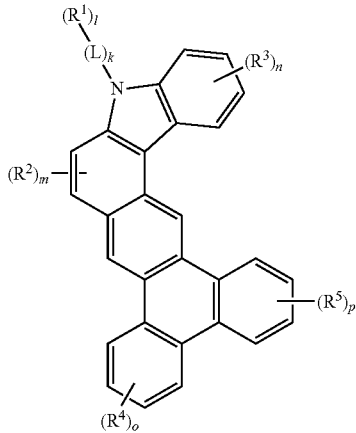

wherein
$R^1$ to $R^5$ are each independently hydrogen, deuterium, a halogen, a substituted or unsubstituted C1 to C30 alkyl group, a substituted or unsubstituted C2 to C30 alkenyl group, a substituted or unsubstituted C2 to C30 alkynyl group, a substituted or unsubstituted C3 to C30 cycloalkyl group, a substituted or unsubstituted C1 to C30 alkoxy group, a substituted or unsubstituted C6 to C30 aryloxy group, a substituted or unsubstituted C6 to C30 arylthiol group, a substituted or unsubstituted C6 to C30 aryl group, a substituted or unsubstituted C2 to C30 heteroaryl group, a substituted or unsubstituted C1 to C30 amine group, a substituted or unsubstituted silyl group, a cyano group, a nitro group, a hydroxy group, a carboxyl group, or a combination thereof, L is a substituted or unsubstituted C1 to C30 alkylene group, a substituted or unsubstituted C6 to C30 arylene group, a substituted or unsubstituted C2 to C30 heteroarylene group, or a combination thereof, k is an integer from 0 to 2, l is an integer from 1 to 3, m is an integer from 0 to 2, and n, o, and p are each independently integers from 0 to 4, and o and p are not simultaneously 0.

10. The organic light emitting diode device of claim 9, wherein the organic layer comprises at least one selected from an electron injection layer (EIL), an electron transport layer (ETL), a hole injection layer (HIL), a hole transport layer (HTL), or an emission layer.

11. The organic light emitting diode device of claim 9, wherein the organic layer comprises an electron injection layer (EIL) or an electron transport layer (ETL).

12. The organic light emitting diode device of claim 11, wherein the electron transport layer (ETL) comprises an electron transporting organic material and a metal-containing material.

13. The organic light emitting diode device of claim 12, wherein the metal-containing material is a Li complex.

14. The organic light emitting diode device of claim 9, wherein the organic layer comprises an emission layer.

15. The organic light emitting diode device of claim 9, wherein the compound is a host in the emission layer.

16. The organic light emitting diode device of claim 9, wherein the organic layer comprises a hole injection layer (HIL) or a hole transport layer (HTL).

17. The organic light emitting diode device of claim 16, wherein the hole injection layer (HIL) or hole transport layer (HTL) further comprises a charge-generating material.

18. A display device comprising the organic light emitting diode device of claim 9.

19. The organic light emitting diode device of claim 9, wherein in Chemical Formula 1, at least one of $R^4$ and $R^5$ is a substituted or unsubstituted C1 to C30 amine group.

20. The organic light emitting diode device of claim 9, wherein in Chemical Formula 1, at least one of $R^4$ and $R^5$ is a C1 to C30 amine group substituted with an aryl group.

* * * * *